United States Patent
Ho et al.

(10) Patent No.: US 10,505,040 B2
(45) Date of Patent: Dec. 10, 2019

(54) METHOD OF MANUFACTURING A SEMICONDUCTOR DEVICE HAVING A GATE WITH FERROELECTRIC LAYER

(71) Applicant: TAIWAN SEMICONDUCTOR MANUFACTURING CO., LTD., Hsinchu (TW)

(72) Inventors: Chia-Cheng Ho, Hsinchu (TW);
Ming-Shiang Lin, Hsinchu (TW);
Cheng-Yi Peng, Taipei (TW);
Chun-Chieh Lu, Taipei (TW);
Chih-Sheng Chang, Hsinchu (TW);
Carlos H. Diaz, Mountain View, CA (US)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 15/860,912

(22) Filed: Jan. 3, 2018

(65) Prior Publication Data
US 2019/0097061 A1 Mar. 28, 2019

Related U.S. Application Data

(60) Provisional application No. 62/562,561, filed on Sep. 25, 2017.

(51) Int. Cl.
*H01L 21/8234* (2006.01)
*H01L 29/78* (2006.01)
(Continued)

(52) U.S. Cl.
CPC .... *H01L 29/78391* (2014.09); *H01L 21/0228* (2013.01); *H01L 21/02181* (2013.01);
(Continued)

(58) Field of Classification Search
CPC ......... H01L 29/78391; H01L 21/02181; H01L 21/0228; H01L 21/28185; H01L 21/28194;
(Continued)

(56) References Cited

U.S. PATENT DOCUMENTS 8,836,016 B2   9/2014   Wu et al.
8,841,701 B2   9/2014   Lin et al.
(Continued)

*Primary Examiner* — Shahed Ahmed
(74) *Attorney, Agent, or Firm* — McClure, Qualey & Rodack, LLP

(57) ABSTRACT

A method for manufacturing a semiconductor device comprises forming a first fin and a second fin on a first active region and a second active region of a semiconductor substrate, respectively. A first dummy gate is formed over the first fin and a second dummy gate is formed over the second fin, wherein the first dummy gate has a first gate width along a lengthwise direction of the first fin, the second dummy gate has a second gate width along the lengthwise direction of the second fin, the first gate width is different from the second gate width. At least one of the first dummy gate and the second dummy gate is removed. A ferroelectric layer is then formed over the semiconductor substrate, in which the first dummy gate and/or the second dummy gate is removed. At least one metal gate electrode is formed on the ferroelectric layer.

20 Claims, 40 Drawing Sheets

(51) Int. Cl.
| | |
|---|---|
| *H01L 29/66* | (2006.01) |
| *H01L 21/66* | (2006.01) |
| *H01L 21/28* | (2006.01) |
| *H01L 21/3213* | (2006.01) |
| *H01L 29/08* | (2006.01) |
| *H01L 29/51* | (2006.01) |
| *H01L 21/02* | (2006.01) |
| *H01L 27/02* | (2006.01) |
| *H01L 29/49* | (2006.01) |
| *H01L 27/088* | (2006.01) |
| *H01L 21/3105* | (2006.01) |

(52) U.S. Cl.
CPC .. *H01L 21/28185* (2013.01); *H01L 21/28194* (2013.01); *H01L 21/32139* (2013.01); *H01L 21/823431* (2013.01); *H01L 21/823456* (2013.01); *H01L 22/14* (2013.01); *H01L 27/0207* (2013.01); *H01L 29/0847* (2013.01); *H01L 29/40111* (2019.08); *H01L 29/516* (2013.01); *H01L 29/517* (2013.01); *H01L 29/6684* (2013.01); *H01L 29/6656* (2013.01); *H01L 29/66545* (2013.01); *H01L 21/28088* (2013.01); *H01L 21/31053* (2013.01); *H01L 21/823462* (2013.01); *H01L 27/088* (2013.01); *H01L 29/4966* (2013.01)

(58) Field of Classification Search
CPC ......... H01L 21/28291; H01L 21/32139; H01L 21/823431; H01L 21/823456; H01L 21/823462; H01L 22/14; H01L 27/0207; H01L 27/088; H01L 29/0847; H01L 29/516; H01L 29/517; H01L 29/66545; H01L 29/6656; H01L 29/6684; H01L 21/28088
See application file for complete search history.

(56) References Cited

U.S. PATENT DOCUMENTS

| | | | |
|---|---|---|---|
| 8,847,293 B2 | 9/2014 | Lee et al. | |
| 8,853,025 B2 | 10/2014 | Zhang et al. | |
| 8,962,400 B2 | 2/2015 | Tsai et al. | |
| 9,093,514 B2 | 7/2015 | Tsai et al. | |
| 9,236,267 B2 | 1/2016 | De et al. | |
| 9,245,805 B2 | 1/2016 | Yeh et al. | |
| 9,520,482 B1 | 12/2016 | Chang et al. | |
| 9,576,814 B2 | 2/2017 | Wu et al. | |
| 2003/0138977 A1* | 7/2003 | Cerva | H01L 21/31691 438/3 |
| 2010/0006954 A1* | 1/2010 | Huang | H01L 21/0214 257/410 |
| 2015/0054029 A1* | 2/2015 | Jangjian | H01L 29/4966 257/190 |
| 2017/0358457 A1* | 12/2017 | Jang | H01L 29/6653 |
| 2018/0350940 A1* | 12/2018 | Yoo | H01L 29/516 |
| 2019/0019551 A1* | 1/2019 | Lee | G11C 11/5657 |
| 2019/0043858 A1* | 2/2019 | Lin | H01L 27/0886 |

* cited by examiner

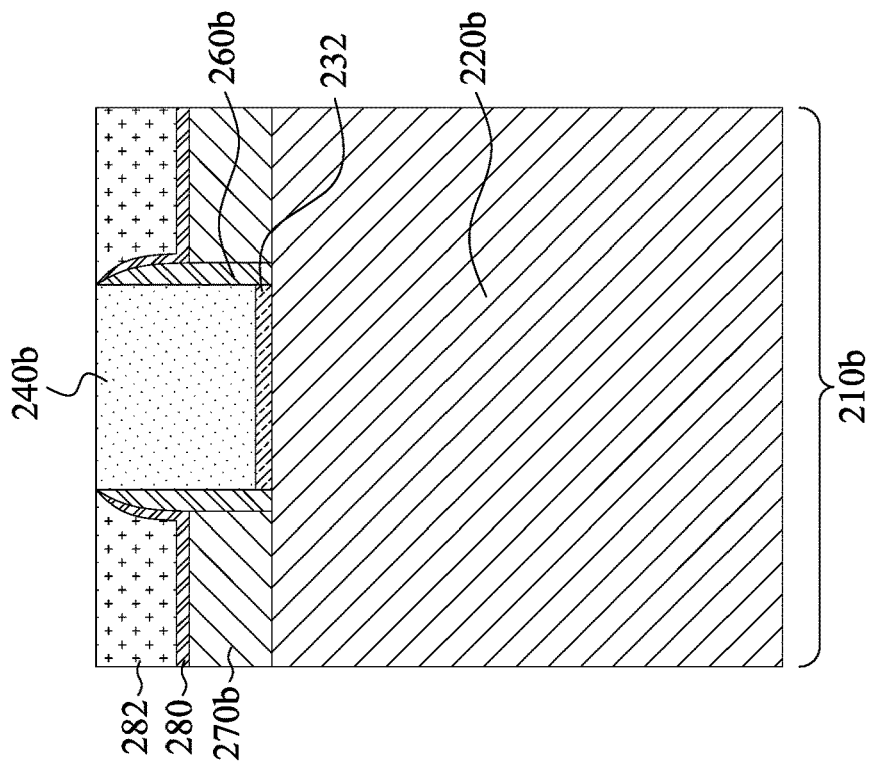
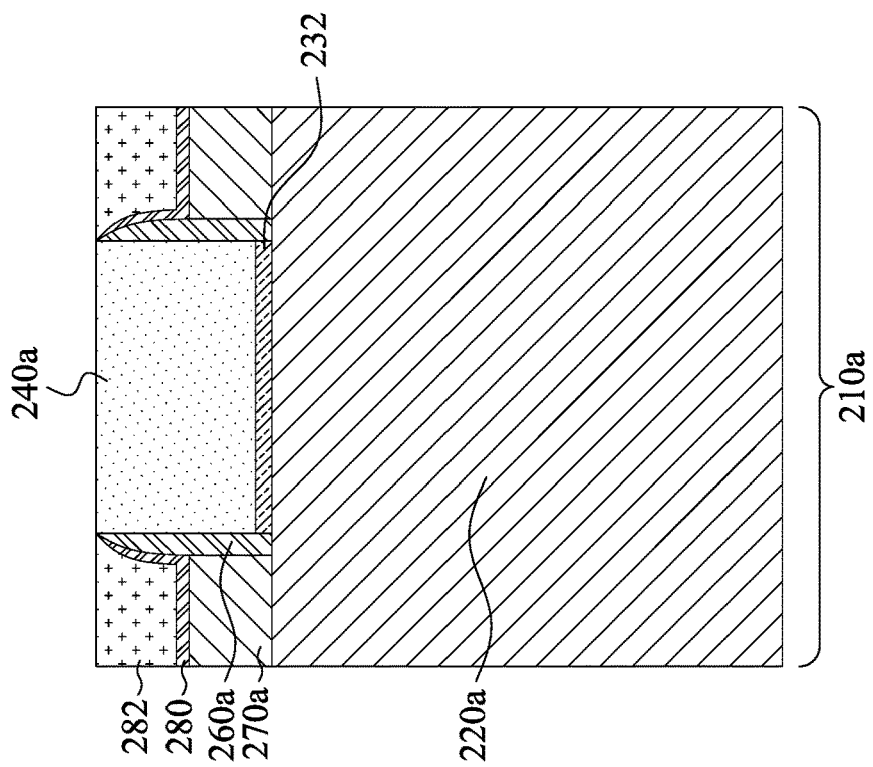

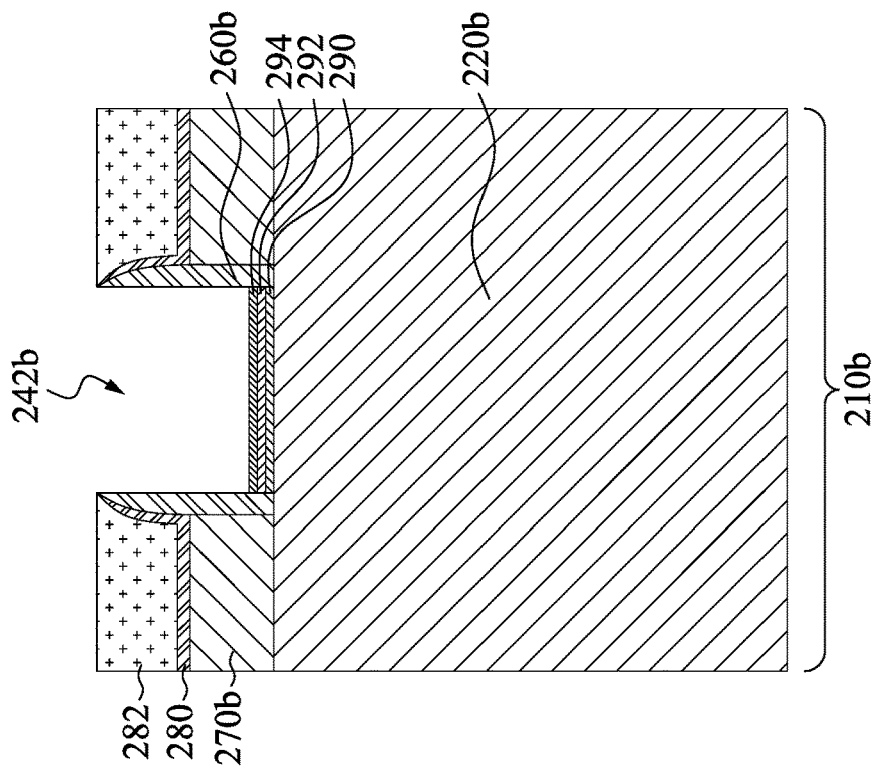
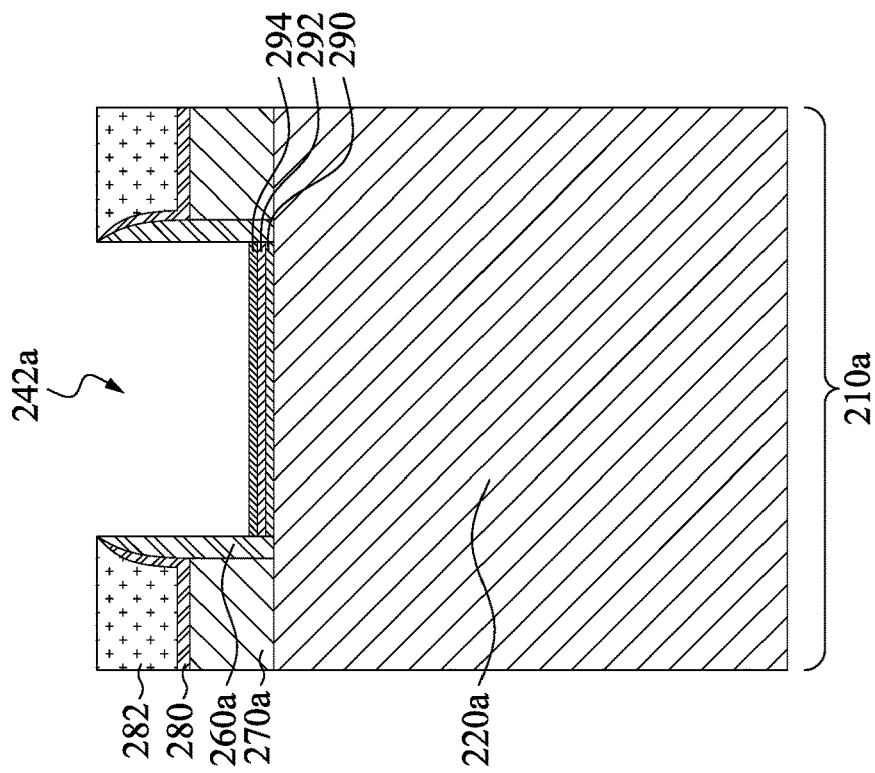

METHOD OF MANUFACTURING A SEMICONDUCTOR DEVICE HAVING A GATE WITH FERROELECTRIC LAYER

PRIORITY CLAIM AND CROSS-REFERENCE

This application claims priority to U.S. Provisional Application Ser. No. 62/562,561, filed Sep. 25, 2017, which is herein incorporated by reference.

BACKGROUND

Integrated circuits semiconductor devices are used in a large number of electronic devices, such as computers, cell phones, and others. Integrated circuits include semiconductor devices that are formed on semiconductor wafers by depositing various thin films of material over the semiconductor wafers, and patterning the thin films of material to form the integrated circuits. Integrated circuits typically include field-effect transistors (FETs).

A semiconductor device such as metal-oxide-semiconductor field-effect transistors (MOSFETs) is scaling down through various advanced technology nodes, device density and device performance are challenged by device layout. Due to more and more restricted design rule (RDR) limitations in advanced technology nodes, there are various concerns related to the density, processing windows, and circuit performance.

Conventionally, increasing or decreasing the threshold voltage (Vt) of the semiconductor device is performed by using different work function metal and metal gate. Besides, for the specific applications, the circuit maybe needs to insert the unique PMOS or NMOS to enhance the performance, instead of the CMOS. However, conventional approaches have not been entirely satisfactory in all respects.

BRIEF DESCRIPTION OF THE DRAWINGS

Aspects of the instant disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
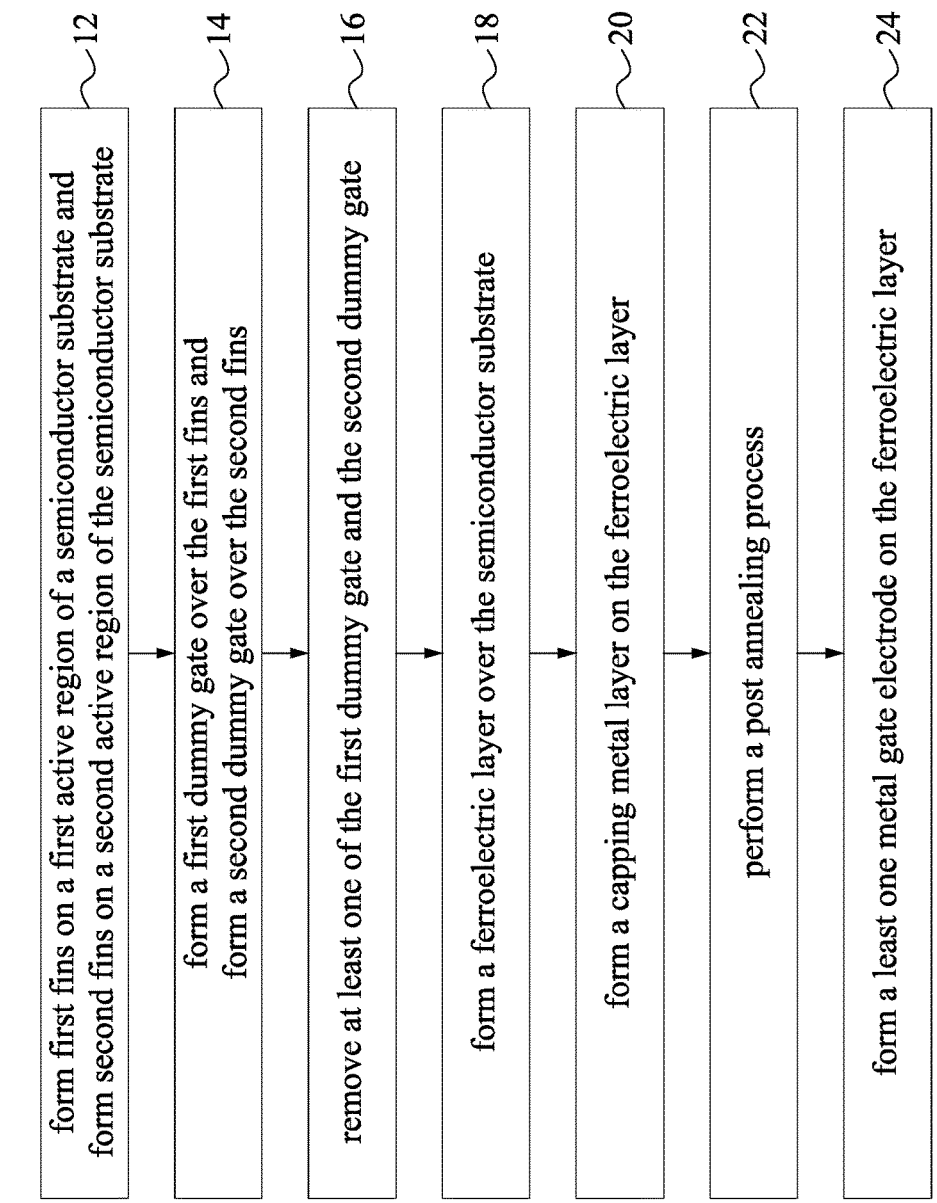
FIG. 1 is a flow chart illustrating a method of manufacturing a semiconductor device in accordance with some embodiments of the instant disclosure.

The following disclosure provides many different embodiments, or examples, for implementing different features of the provided subject matter. Specific examples of components and arrangements are described below to simplify the instant disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the instant disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Negative-capacitance field-effect transistors (NCFETs) incorporating ferroelectric materials ensure lower $V_{DD}$ and achieve steep subthreshold swing (S.S.) for lower standby power state. These NCFETs may have different gate widths and lengths so as to allow more flexible layout and easier integration in FinFET.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

FIG. 1 is a flow chart of a method 100 for fabricating a semiconductor device in accordance with various embodiments of the instant disclosure. The method 100 begins with operation 12 in which first fins are formed on a first active region of a semiconductor substrate and second fins are formed on a second active region of the semiconductor substrate. The method continues with operation 14 in which a first dummy gate is formed over the first fins and a second dummy gate is formed over the second fins. The method continues with operation 16 in which at least one of the first dummy gate and the second dummy gate is removed. The method continues with operation 18 in which a ferroelectric layer is formed over the semiconductor substrate. The method continues with operation 20 in which a capping metal layer is formed on the ferroelectric layer. The method continues with operation 22 in which a post annealing process is performed. The method continues with operation 24 in which at least one metal gate electrode is formed on the ferroelectric layer. The discussion that follows illustrates embodiments of semiconductor devices that can be fabricated according to the method 100 of FIG. 1. While method 100 is illustrated and described below as a series of acts or events, it will be appreciated that the illustrated ordering of such operations, acts or events are not to be interpreted in a limiting sense. For example, some operations, acts or events may occur in different orders and/or concurrently with other operations, acts or events apart from those illustrated and/or described herein. In addition, not all illustrated operations, acts or events may be required to implement one or more aspects or embodiments of the description herein. Further, one or more of the operations, acts or events depicted herein may be carried out in one or more separate operations, acts or events and/or phases. Further, the method 100 disclosed herein may include additional operations, acts or events.

FIGS. 2A through 14D are respectively perspective and cross-sectional views schematically illustrating various intermediary stages in manufacturing of the semiconductor device in accordance with various embodiments. In FIGS. 2A through 14D, figures ending with an "A" designation are illustrated a perspective view of the semiconductor device, figures with an B designation are illustrated along a similar cross-section Y-Y, figures ending with a "C" designation are illustrated along a similar cross-section X1-X1 (shown in FIG. 5A), and figures ending with a "D" designation are illustrated along a similar cross-section X2-X2 (shown in FIG. 5A).

Figure 2A:
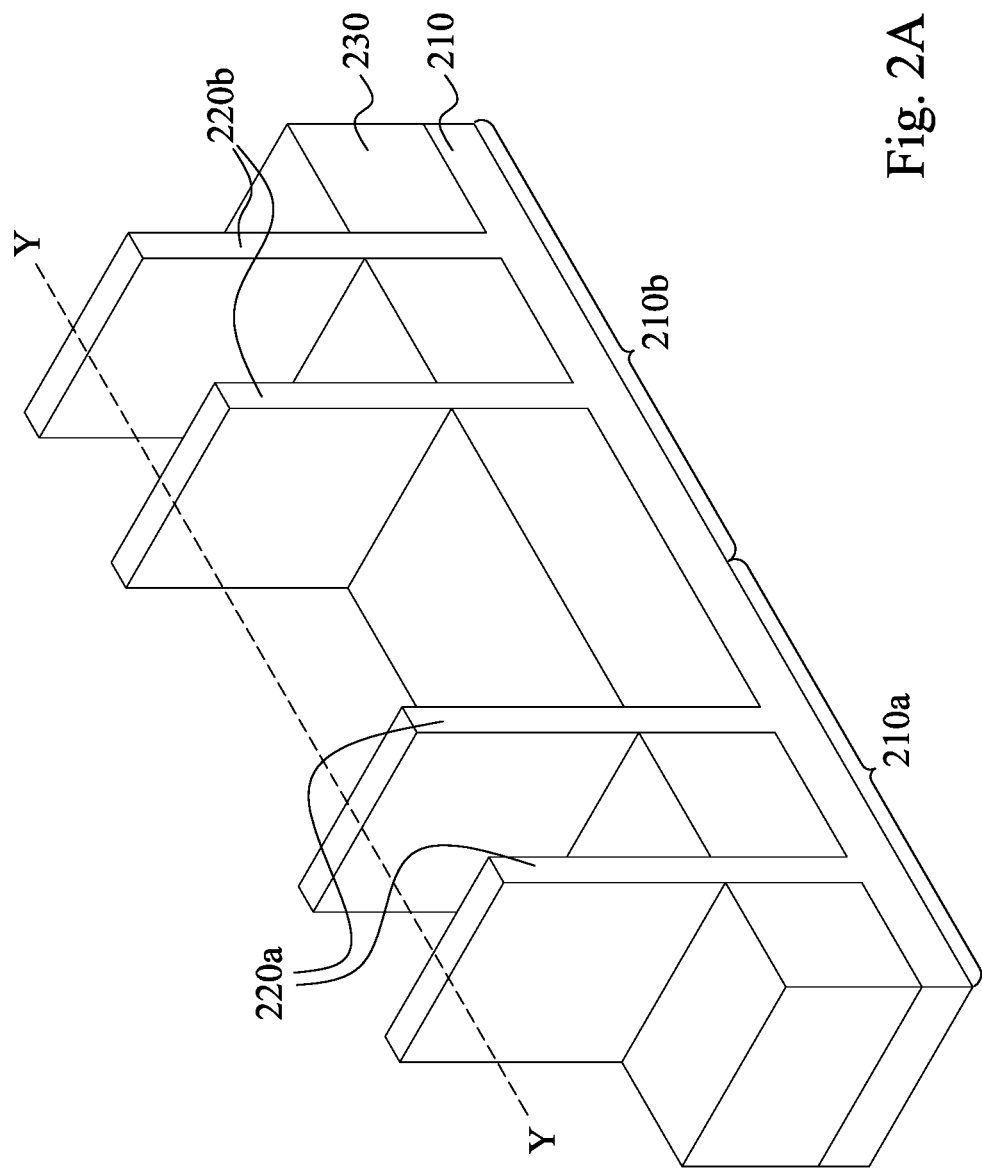
FIGS. 2A through 15 are perspective or cross-sectional views of various intermediary stages in the manufacturing of semiconductor devices in accordance with some embodiments of the instant disclosure.
Figure 2B:
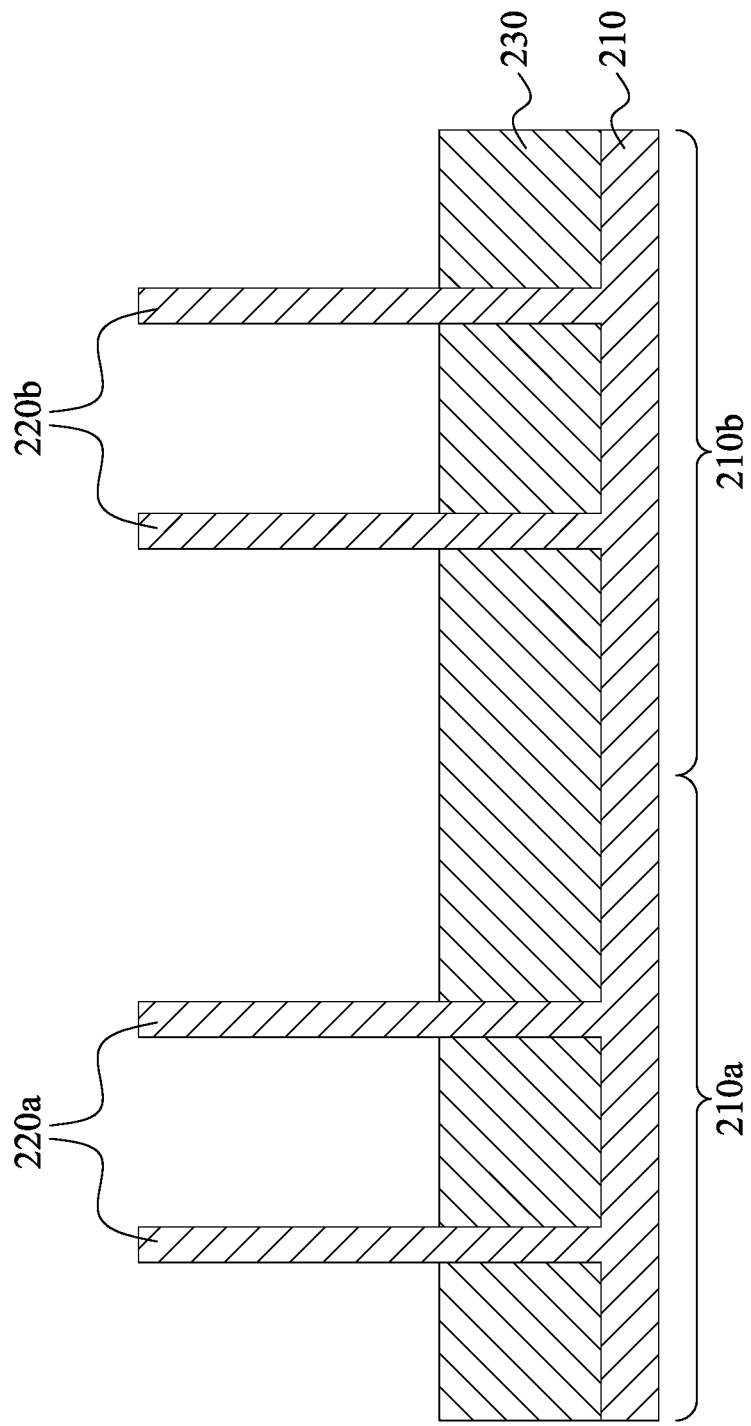

Reference is made to FIGS. 2A and 2B. First fins 220a are formed on a first active region 210a of a semiconductor substrate 210, and second fins 220b are formed on a second active region 210b of the semiconductor substrate 210 (operation 12 of FIG. 1). In some embodiments, the first and second fins 220a and 220b extend along an x direction on the semiconductor substrate 210 in parallel. FIG. 2B is a cross-sectional view taken along the cross-section Y-Y in FIG. 2A. As shown in FIG. 2A, isolation regions such as shallow trench isolation (STI) regions 230 are formed on the semiconductor substrate 210 between the first fins 220a and the second fins 220b in accordance with some embodiments.

The semiconductor substrate 210, for example, may be a bulk semiconductor, a semiconductor-on-insulator (SOI) substrate, or the like, which may be doped (e.g., with a p-type or an n-type dopant) or undoped. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the material of semiconductor substrate 210 may include silicon (Si); germanium (Ge); a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 3A:
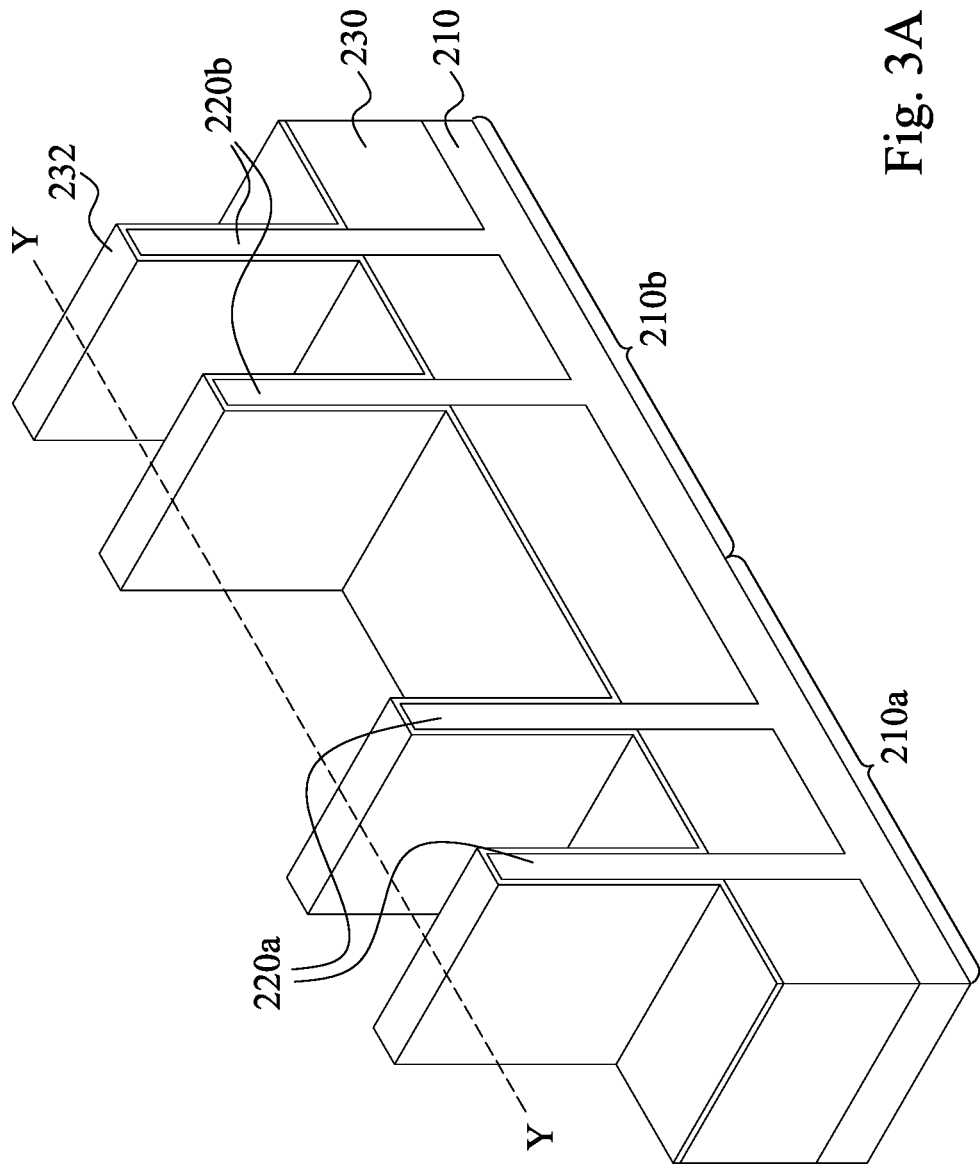
Figure 3B:
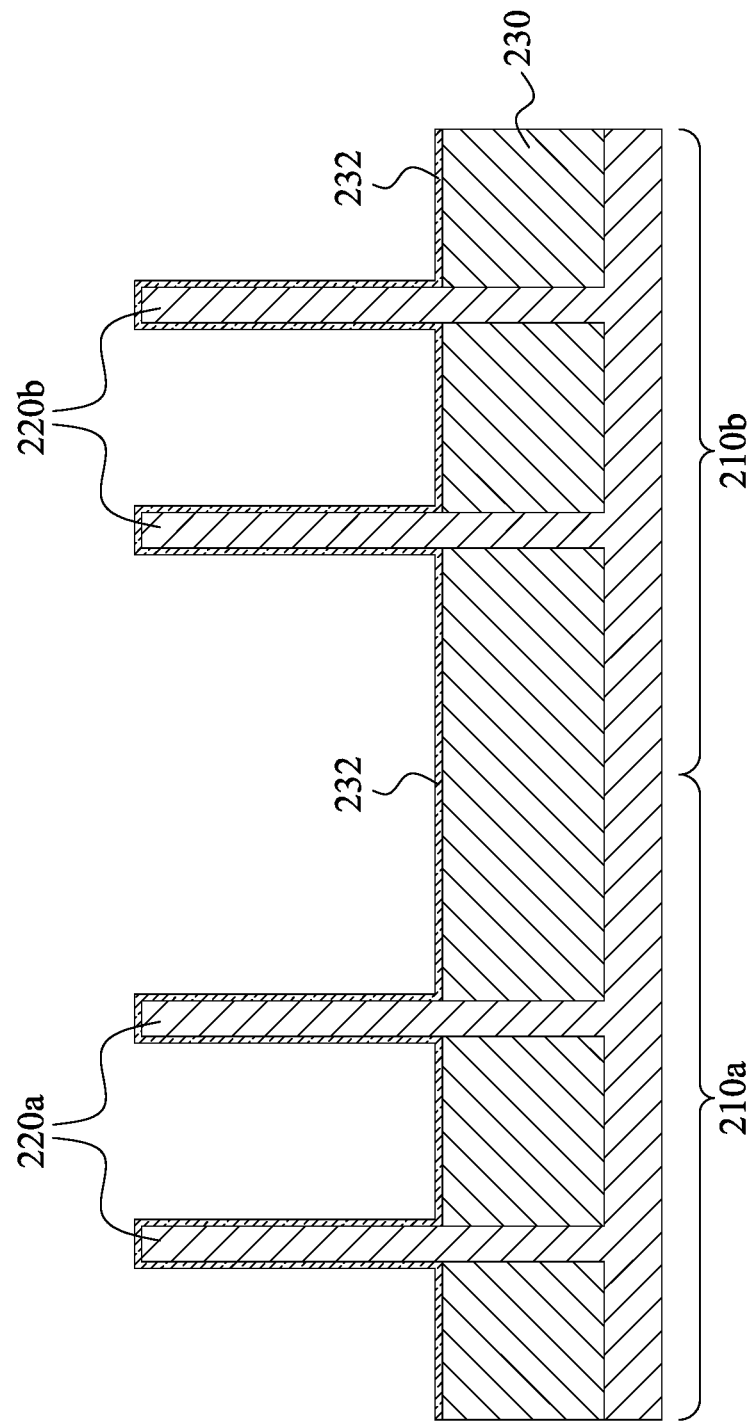

In FIGS. 3A and 3B, a dielectric layer 232 may be conformally formed on the first fins 220a, the second fins 220b, and the semiconductor substrate 210 in accordance with some embodiments. In some examples, the dielectric layer 232 may include a semiconductor (e.g., silicon) nitride, a semiconductor (e.g., silicon) oxide, a semiconductor (e.g., silicon) oxynitride, a polymer dielectric, combinations thereof, and the like. In some embodiments, the dielectric layer 232 and the STI regions 230 have the same compositions. In other embodiments, the dielectric layer 232 and the STI regions 230 have different compositions. The formation of dielectric layer 232 may include any suitable deposition method, such as, plasma-enhanced atomic layer deposition (PEALD), chemical vapor deposition (CVD), plasma-enhanced chemical vapor deposition (PECVD), physical vapor deposition (PVD), and the like.

Figure 4:
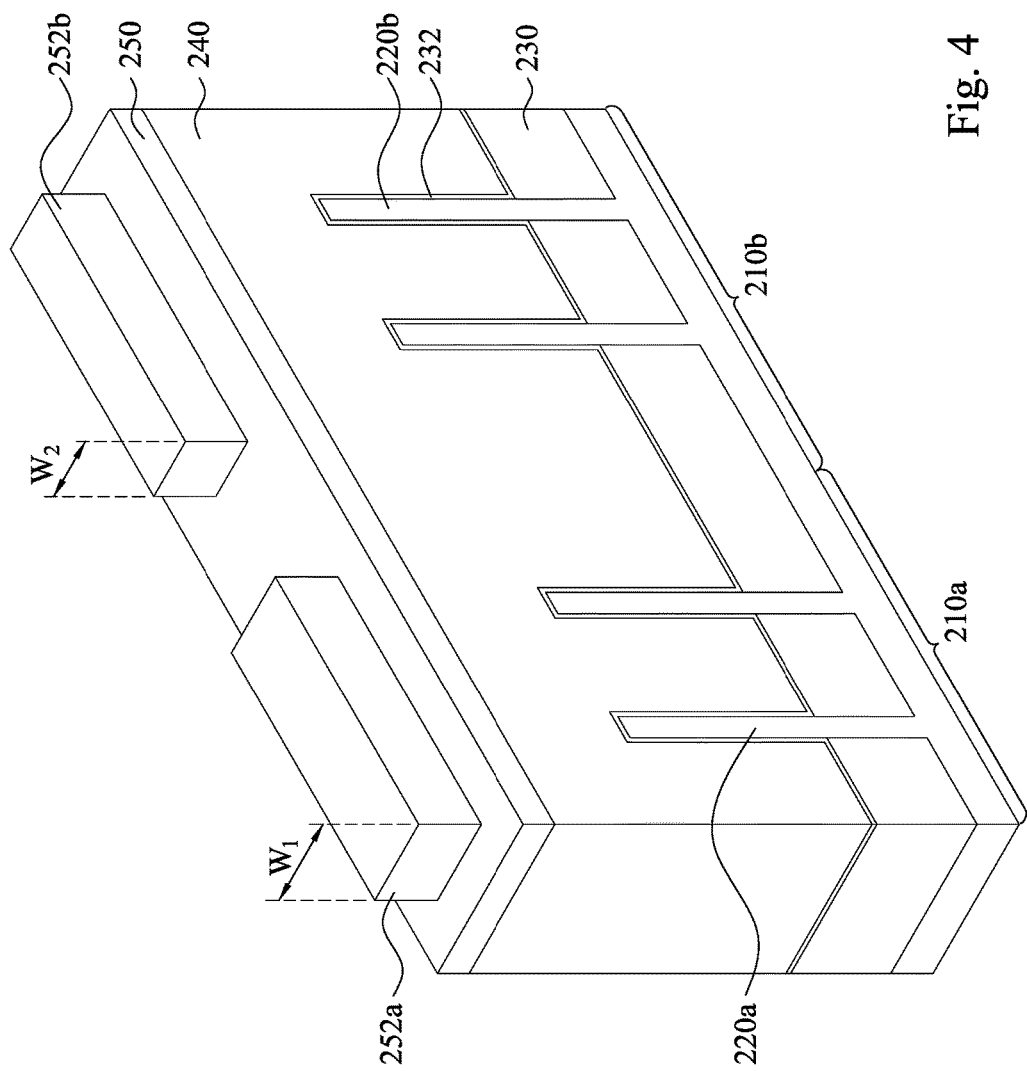

Reference is made to FIG. 4. A dummy gate layer 240, a hard mask layer 250, and a photoresist layer (not shown) are deposited over the first active region 210a and the second active region 210b in accordance with some embodiments. Subsequently, a photolithography process is performed to form a patterned photoresist layer 252a in the first active region 210a and a patterned photoresist layer 252b in the second active region 210b on the hard mask layer 250. As shown in FIG. 4, the photoresist layer 252a has a width $W_1$ and the photoresist layer 252b has a width $W_2$. The width $W_1$ and the width $W_2$ may be different. In some embodiments, the width $W_1$ may be greater than the width $W_2$. In other embodiments, the width $W_1$ may be smaller than the width $W_2$. The widths $W_1$ and $W_2$ of the patterned photoresist layers 252a and 252b will be a gate width of the subsequent formation of dummy gates.

Figure 5A:
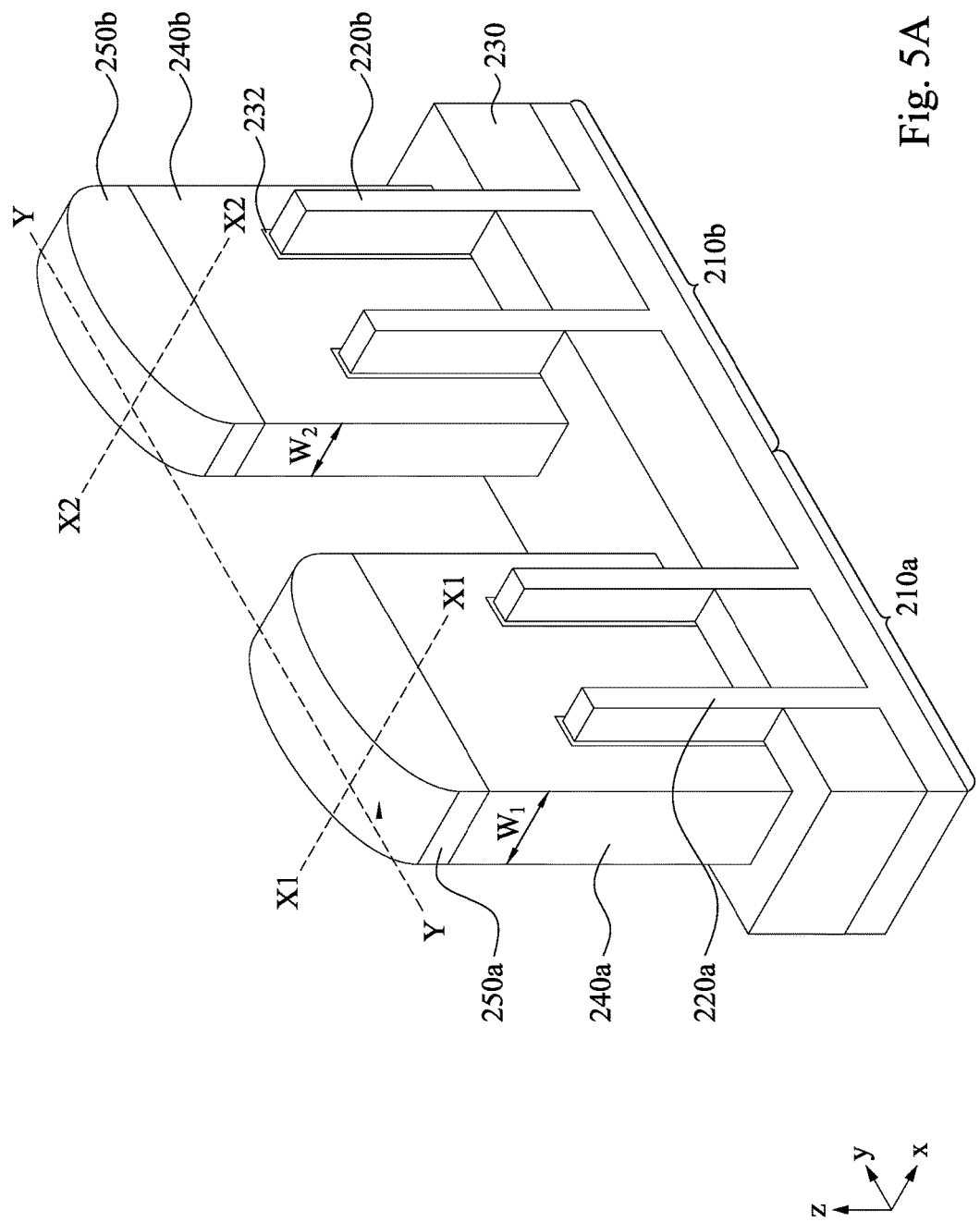
Figure 5B:
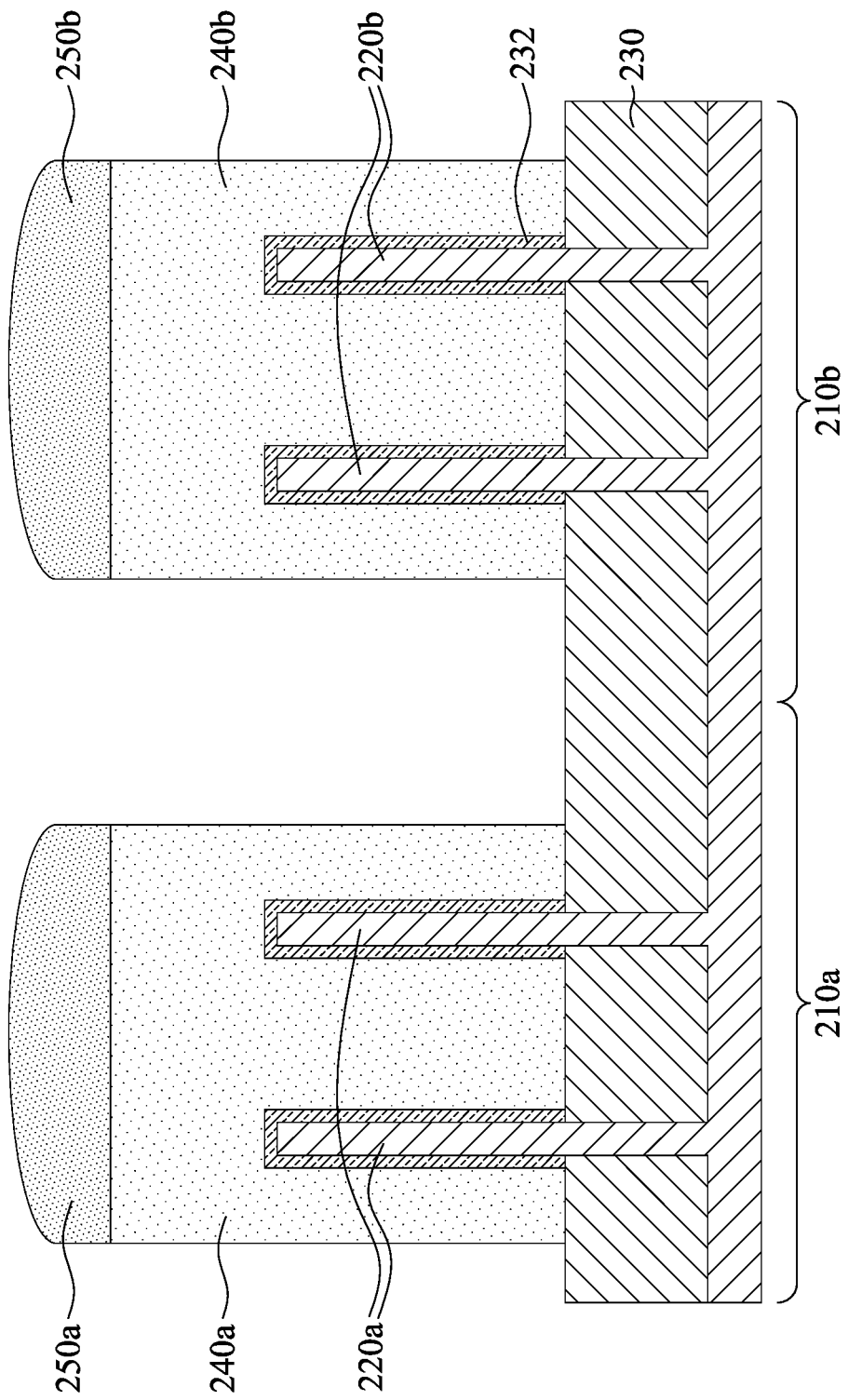
Figure 5D:
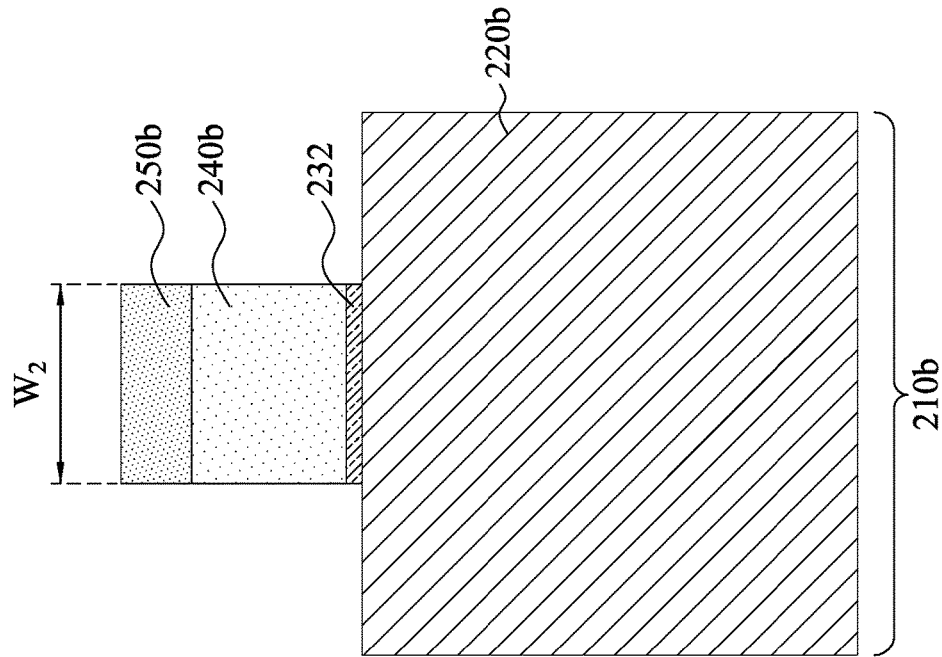
Figure 5C:
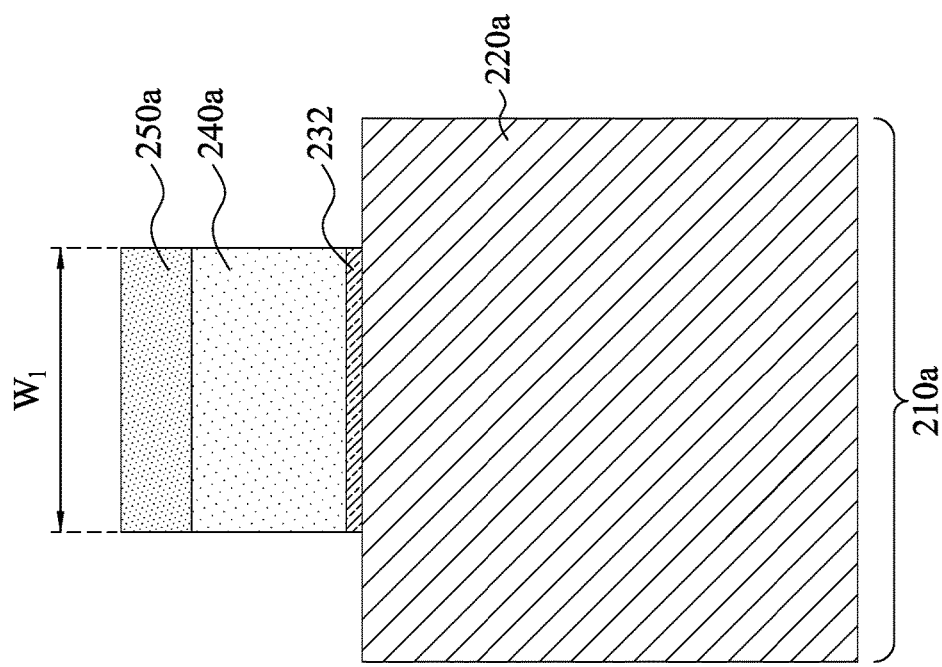
Figure 6A:
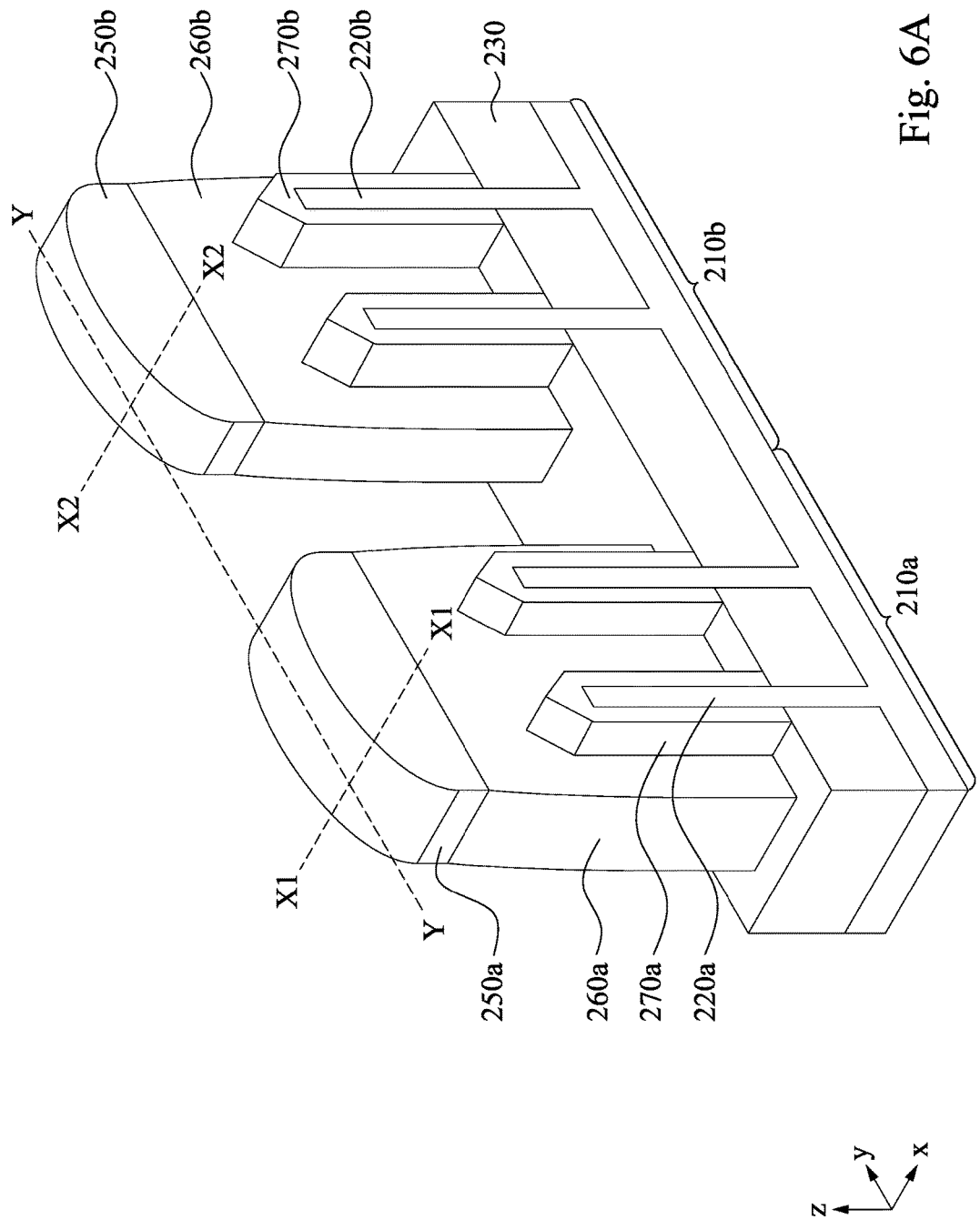
Figure 6B:
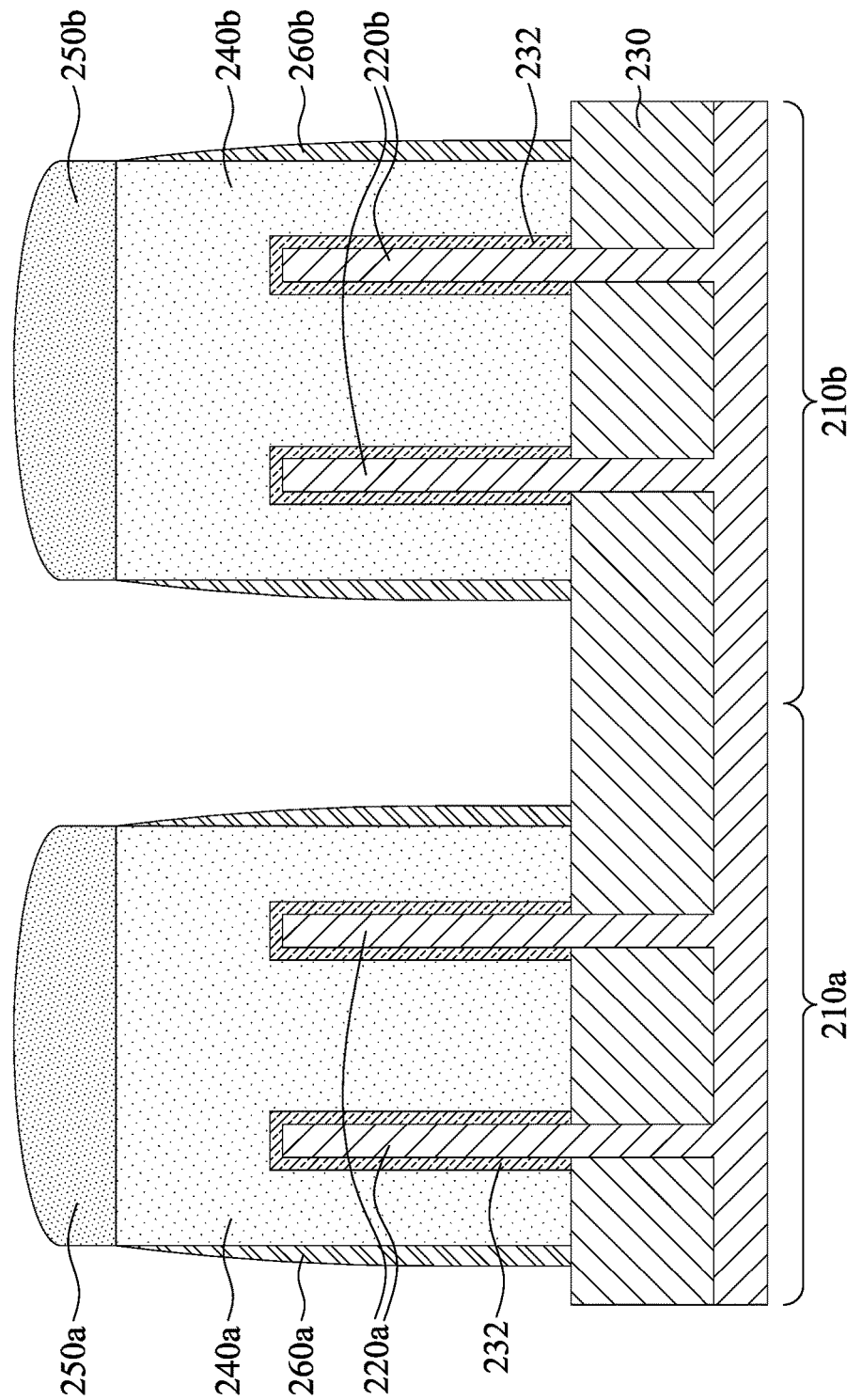
Figure 6D:
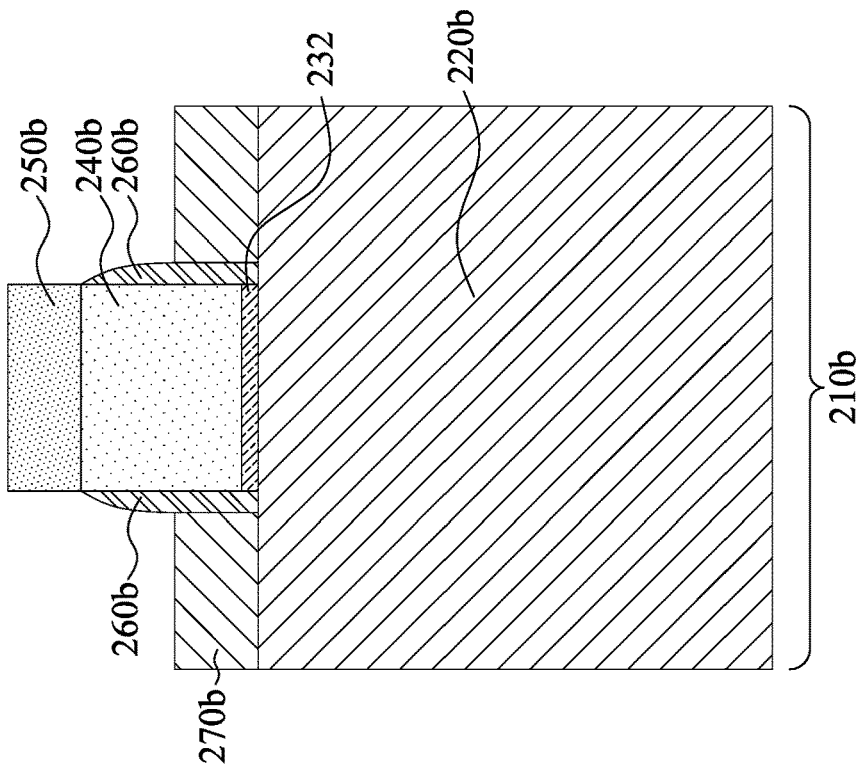
Figure 6C:
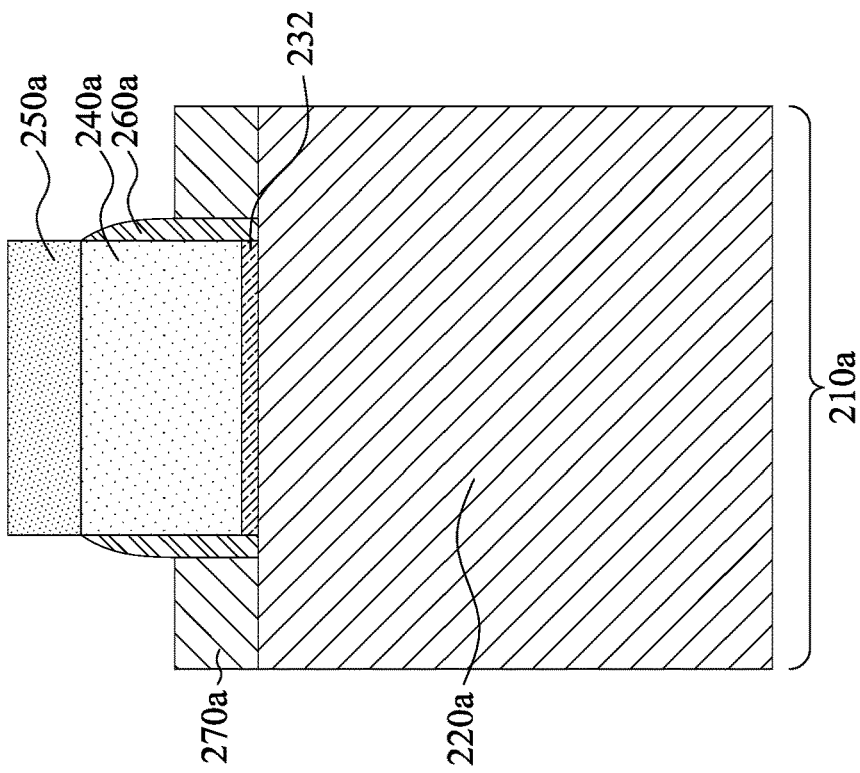

Reference is made to FIGS. 5A to 5D. First dummy gate 240a is formed over the first fins 220a in the first active region 210a and second dummy gate 240b is formed over the second fins 220b in the second active region 210b (operation 14 of FIG. 1). FIG. 5B is a cross-sectional view taken along the cross-section Y-Y in FIG. 5A, and FIGS. 5C and 5D are cross-sectional view taken along the cross-section X1-X1 and X2-X2, respectively. The first dummy gate 240a and the second dummy gate 240b are formed by etching the dummy gate layer 240 and the hard mask layer 250 by using the patterned photoresist layers 252a and 252b as a mask. As shown in FIGS. 5A, 5C and 5D, the first dummy gate 240a has a first gate width $W_1$, and the second dummy gate 240b has a second gate width $W_2$. The first gate width $W_1$ and the second gate width $W_2$ may be different. The first gate width $W_1$ and the second gate width $W_2$ are corresponding to the widths of the patterned photoresist layer 252a and 252b. The different widths of the patterned photoresist layers 252a and 252b produce different gate widths in the first active region 210a and the second active region 210b respectively. The first gate width $W_1$ and the second gate width $W_2$ are measured along the x direction (i.e., parallel to the first and second fins 220a and 220b). In some embodiments, as shown in FIGS. 5A, 5C and 5D, the first gate width $W_1$ is greater than the second gate width $W_2$. In some embodiments, the second gate width $W_2$ may be greater than the first gate width $W_1$. The first dummy gate 240a and the second dummy gate 240b may include, for example, polysilicon, although other materials such as metal silicides, metal nitrides, or the like, may also be used. In some embodiments, the first dummy gate 240a and the second dummy gate 240b may further include hard masks 250a and 250b thereon. The hard masks 250a and 250b may include silicon nitride or silicon oxide, for example. As shown in FIGS. 5A and 5B, the first dummy gate 240a crosses over the first fins 220a, and the second dummy gate 240b also crosses over the second fins 220b. The first dummy gate 240a is spaced apart from the second dummy gate 240b.

Referring now to FIGS. 6A to 6D, spacer 260a and spacer 260b are formed around the first dummy gate 240a and the second dummy gate 240b according to some embodiments. The spacer 260a and spacer 260b are formed by depositing a spacer material over the first dummy gate 240a and the second dummy gate 240b and thereafter performing a patterning process (e.g., an etching process) on the spacer material. The patterning process leaves the spacer 260a and spacer 260b on the lateral side of the first and second dummy gates 240a and 240b exposed. The spacer material may include a dielectric material. In some embodiments, the spacer material includes silicon oxide or silicon nitride.

Still referring to FIGS. 6A to 6D, after the spacer 260a and spacer 260b are formed, first and second source/drain regions 270a and 270b are formed according to some embodiments. In some embodiments, a portion of the first fins 220a, which is not covered by the spacer 260a, undergoes an epitaxial growing process to form the first source/drain regions 270a on either side of the first dummy gate 240a. Similarly, an epitaxial growing process is performed on a portion of the second fins 220b, which is not covered by the spacer 260b, to form the second source/drain regions 270b on either side of the second dummy gate 240b. In some embodiments, the first source/drain regions 270a and the second source/drain regions 270b may be epitaxially grown by a molecular beam epitaxy (MBE) process, a chemical vapor deposition (CVD) process such as a metal organic CVD (MOCVD) process, and/or other suitable epitaxial growth processes. The first source/drain regions 270a and second source/drain regions 270b may include silicon (Si), germanium (Ge) or silicon germanium (SiGe). In some embodiments, the first source/drain regions 270a may be doped with an n-type dopant such as phosphorus (P), arsenic (As) and antimony (Sb), and the second source/drain regions 270b may be doped with a p-type dopant such as boron (B), aluminum (Al), indium (In), and gallium (Ga) in a dopant concentration from about 5E20 to 6E21 $cm^{-3}$. More specifically, the n-type first source/drain regions 270a may include, for example, SiP, SiAs, SiGeP, SiGeAs, GeP, GeAs, SiGeSn, other III-V compound semiconductor, or the like. The p-type second source/drain regions 270b may include, for example, SiB, SiGa, SiGeB, SiGeGa, GeB, GeGa, SiGeSn, other III-V compound semiconductor, or the like. The first and second dummy gates 240a and 240b are of n-type and p-type source/drain regions respectively and are formed in a dual epitaxial process.

Figure 7A:
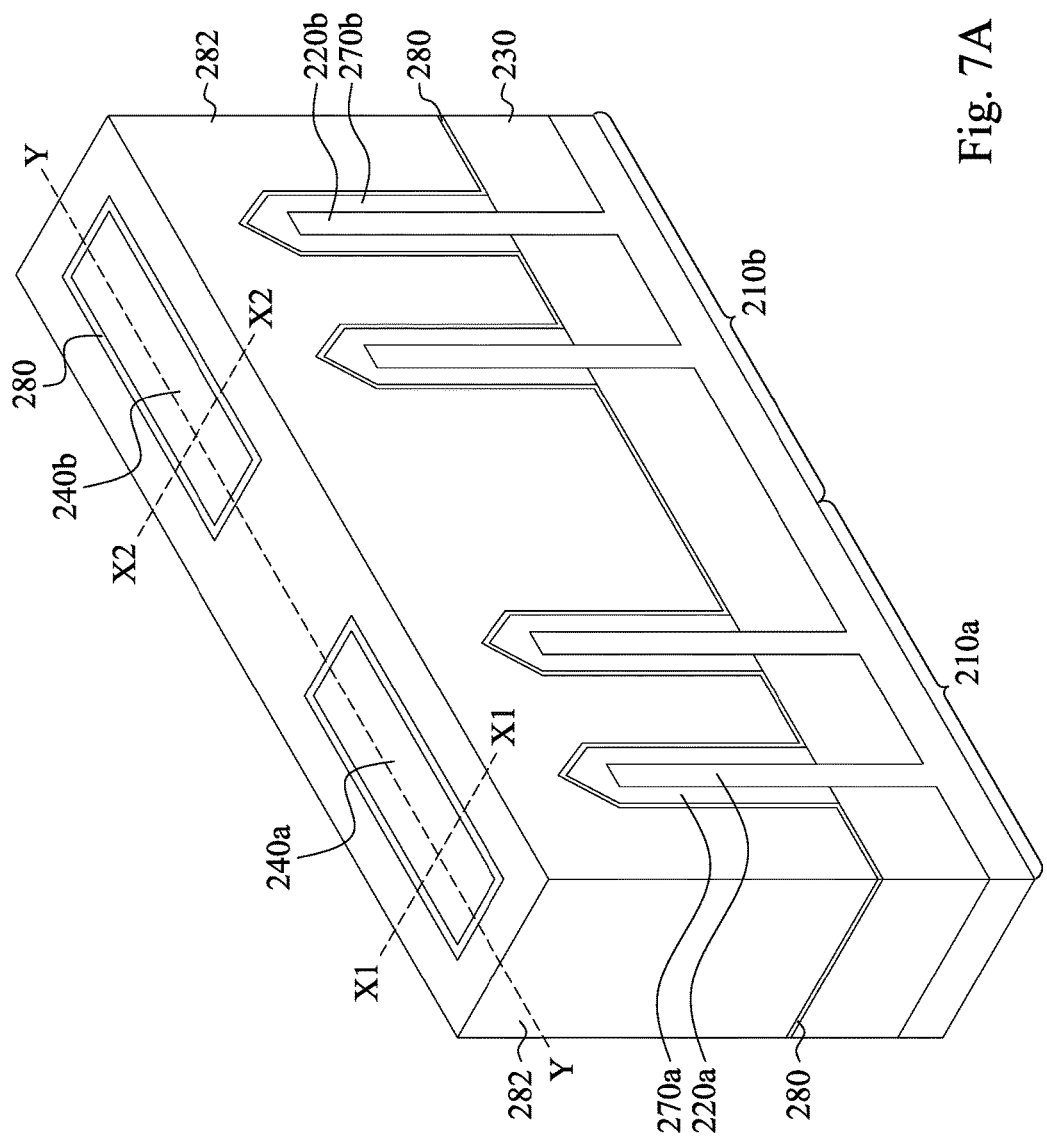
Figure 7B:
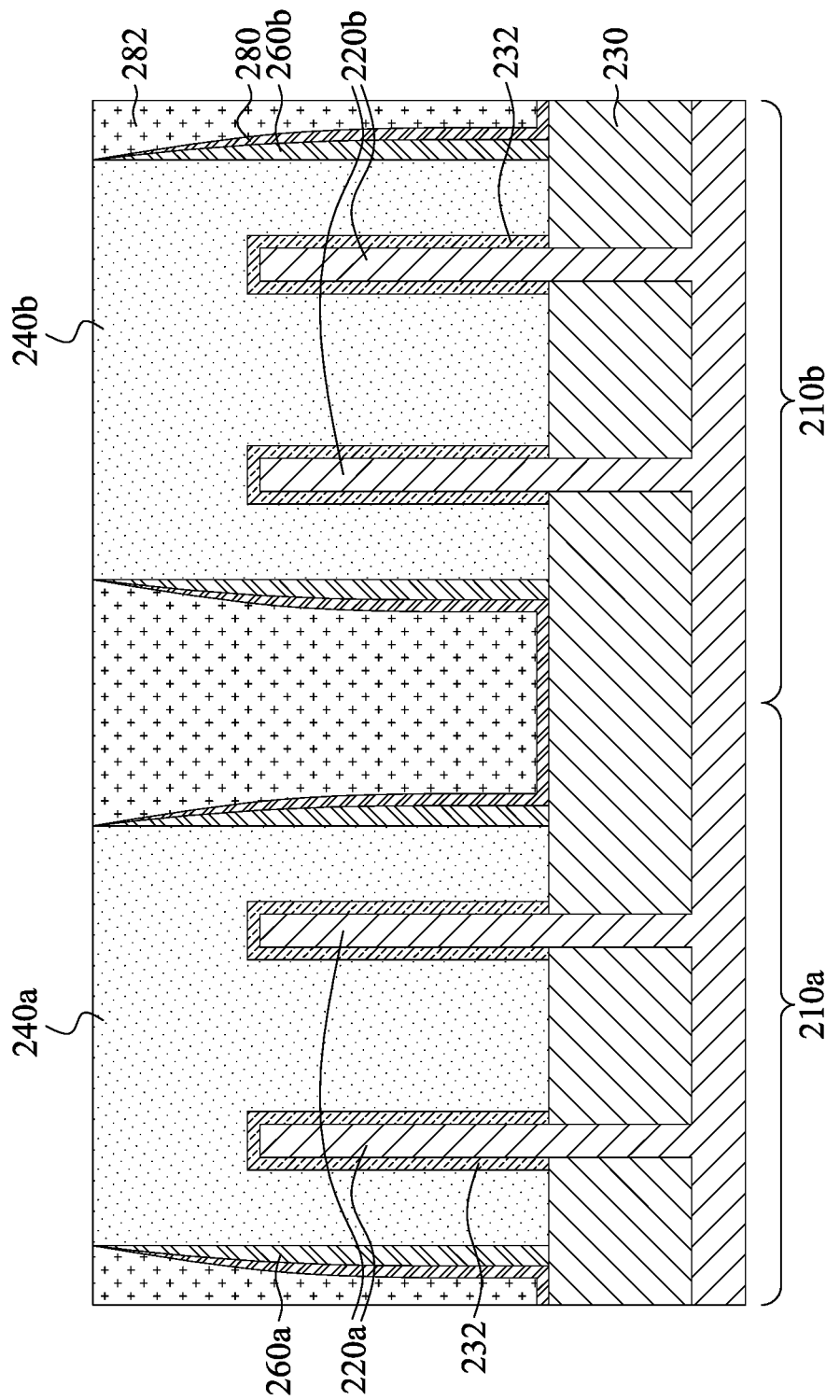

Reference is made to FIGS. 7A to 7D. Contact etch stop layer (CESL) 280 is formed over the semiconductor substrate 210 according to some embodiments. In some embodiments, CESL 280 includes silicon nitride, silicon carbide, or other dielectric materials. As shown in FIGS. 7B, 7C, and 7D, the CESL 280 covers the STI regions 230, the first and second source/drain regions 270a and 270b, and the spacers 260a and 260b. Inter-layer dielectric (ILD) layer 282 is formed over the CESL 280 according to some embodiments. The ILD layer 282 may be blanket deposited to a height higher than the hard masks 250a and 250b. Subsequently, a planarization process is optionally performed to remove excess portions of the ILD layer 282 and CESL 280. The planarization process terminates when the top surface of the first dummy gate 240a and the second dummy gate 240b are exposed. The planarization process may be, for example, chemical mechanical polish (CMP). The hard masks 250a and 250b (as shown in FIGS. 6A-6D) are removed during the planarization process. In some embodiments, the ILD layer 282 may include flowable oxide formed by, for example, flowable chemical vapor deposition (FCVD). In other embodiments, the ILD layer 282 may be a spin-on glass formed using spin-on coating. For example, the ILD layer 282 may include phosphor-silicate glass (PSG), tetra-ethyl orthosilicate (TEOS) oxide, TiN, SiOC, or other low-k nonporous dielectric materials.

Figure 8A:
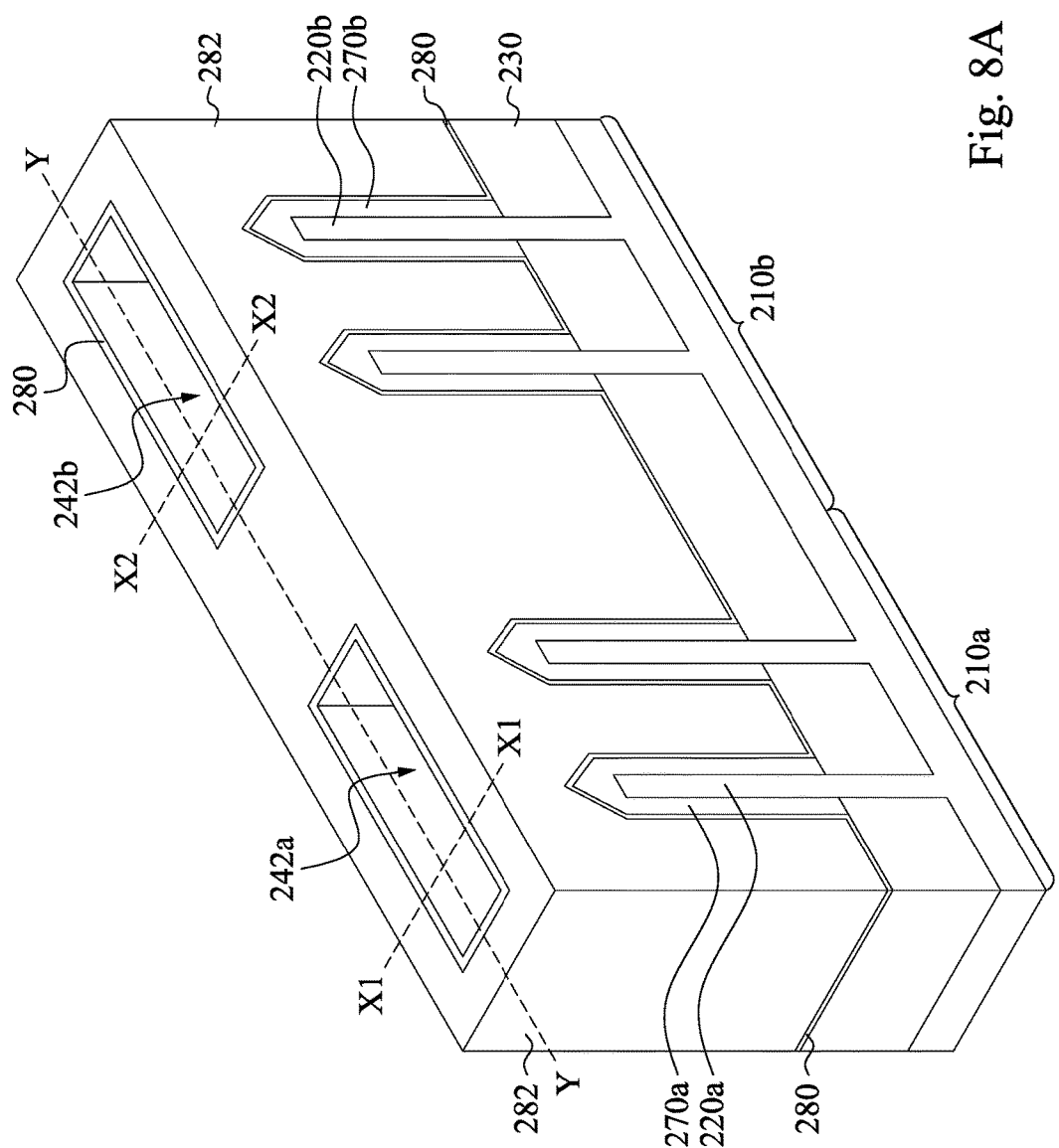
Figure 8B:
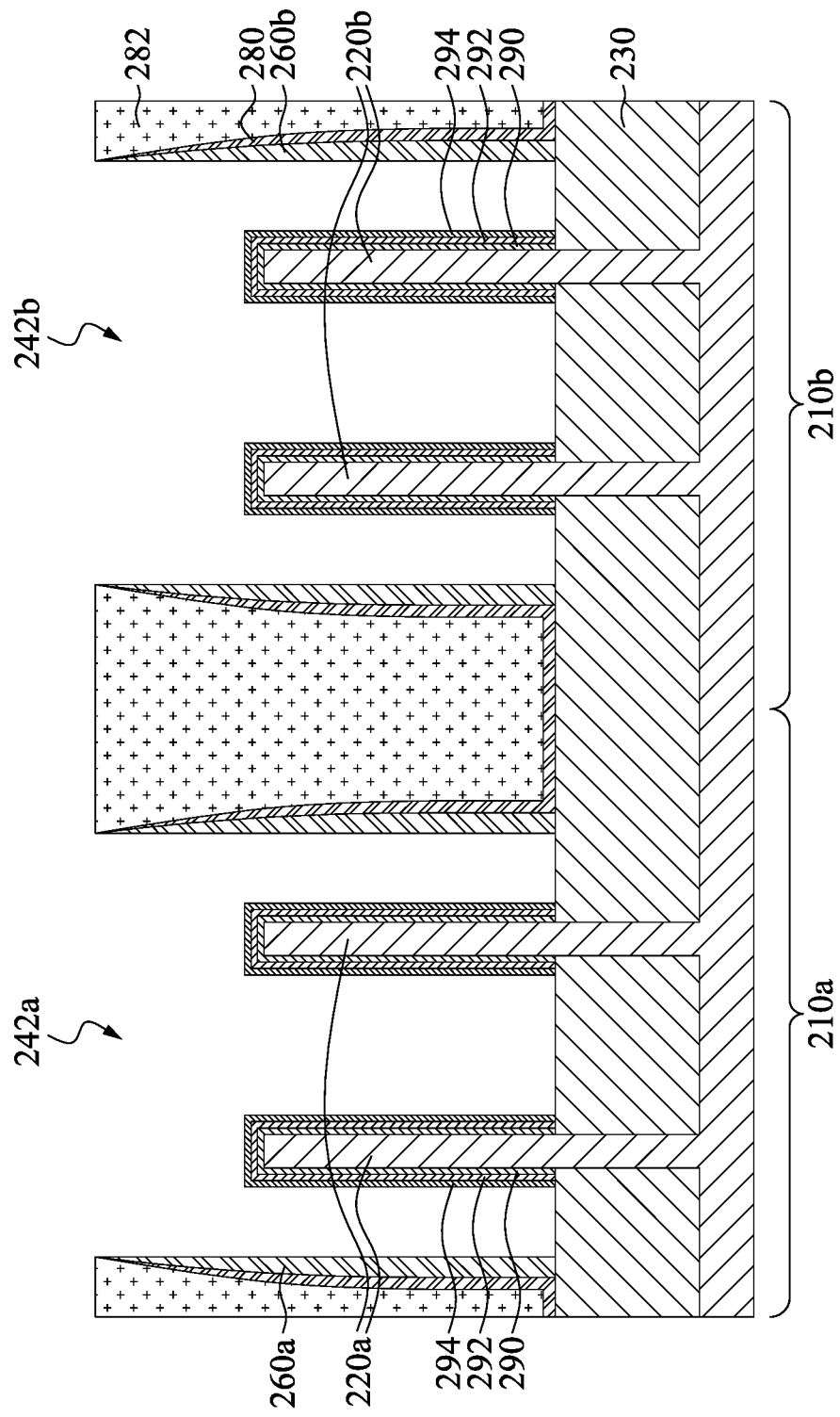

Reference is made to FIG. 8A. At least one of the first dummy gate 240a and the second dummy gate 240b is removed (operation 16 of FIG. 1). In some embodiments, as shown in FIG. 8A, the first dummy gate 240a and the second dummy gate 240b are both removed. Recesses 242a and 242b are formed as a result of the removal of first dummy gate 240a and second dummy gate 240b. In some embodiments the removal of the first and second dummy gates 240a and 240b results in the exposure of the underlying dielectric layer 232 shown in FIG. 7B. The dielectric layer 232 is subsequently removed according to some embodiments, and the underlying first fins 220a and second fins 220b are exposed. In some embodiments, the first dummy gate 240a, the second dummy gate 240b and the dielectric layer 232 are removed by a dry etch, wet etch, combination of dry and wet etch, or other suitable process.

Reference is still made to FIGS. 8A-8D. An interfacial layer (IL) 290 and a high-k dielectric layer 292 are formed on the first and second fins 220a and 220b according to some embodiments. The IL 290 may include silicon oxide formed by, for example, an atomic layer deposition (ALD), thermal oxidation or UV-Ozone oxidation. The IL 290 conforms to the first and second fins 220a and 220b, and the STI regions 230 and the spacers 260a and 260b are free of the IL 290. The high-k dielectric layer 292 is conformally disposed on the IL 290. The high-k dielectric layer 292 is formed by, for example, ALD. Other methods to form the high-k dielectric layer include metal-organic chemical vapor deposition (MOCVD), physical vapor deposition (PVD), UV-Ozone Oxidation, molecular beam epitaxy (MBE), or the like. The high-k dielectric layer may include materials such as LaO, AlO, ZrOTiO, $Ta_2O_5$, $Y_2O_3$SrTiO$_3$ (STO), BaTiO$_3$ (BTO), BaZrO, HfZrO, HfZrON, HfLaO, HfSiO, HfSiON, LaSiO, AlSiO, HfTaO, HfTiO, or other suitable materials.

Reference is still made to FIGS. 8A-8D. A ferroelectric layer 294 is formed over the high-k dielectric layer 292 (operation 18 of FIG. 1). In some embodiments, the ferroelectric layer 294 may include $HfO_2$, $Al_2O_3$, $TiO_2$, barium strontium titanate (BST), lead zirconate titanate (PZT), or the like. In examples, the ferroelectric layer 294 may be formed using thermal ALD and PEALD. In yet some examples, the ferroelectric layer 294 is formed by in-situ doping a dopant along with Hf-containing precursor during ALD. The dopant includes Zr, Al, La Y, Gd, Sr, or the like. The precursor may be, for example, $HfCl_4$, $HfI_4$, TDMA-Hf, TEMA-Hf, or the like. In some embodiments, an oxidant may be used to facilitate the reaction, and the oxidant may be, for example, $O_3$, $H_2O$, $O_2$, or the like. In some embodiments, the ferroelectric layer 294 formation is conducted under about 100° C. to 500° C. and about 0.1 torr to 300 torr for 0.01 second to 200 seconds. The resulting ferroelectric layer 294 has a thickness between about 0.1 nm to 50 nm.

According to some embodiments, the high-k dielectric layer 292 and the ferroelectric layer 294 may include similar materials, while the ferroelectric layer 294 is doped with metallic dopant and may undergo further modification process, such that the ferroelectric layer 294 has different properties from the high-k dielectric layer 292. For example, the ferroelectric layer 294 may have a resistivity lower than the high-k dielectric layer 292. In some embodiments, the high-k dielectric layer 292 may be omitted. The ferroelectric layer 294 is directly formed on the IL 290. In some embodiments, the IL 290 and the high-k dielectric layer 292 may be both omitted, and the ferroelectric layer 294 is directly formed on the first and second fins 220a and 220b.

In some embodiments, after forming the ferroelectric layer 294, a first monitoring process is performed to inspect or monitor the ferroelectricity of the ferroelectric layer 294. The ferroelectric property of the ferroelectric layer 294 is affected by various factors including, but not limited to, the elements contained, the percentage of the elements, and the phase of the resulting crystal structure. The crystal structure is also affected by the deposition process conditions and post-treatment conditions during the formation of the ferroelectric layer 294. The ferroelectric property of the ferroelectric layer 294 is highly sensitive to its composition and reaction conditions. The examination process is used to check the factors mentioned above according to some embodiments.

Figure 9:
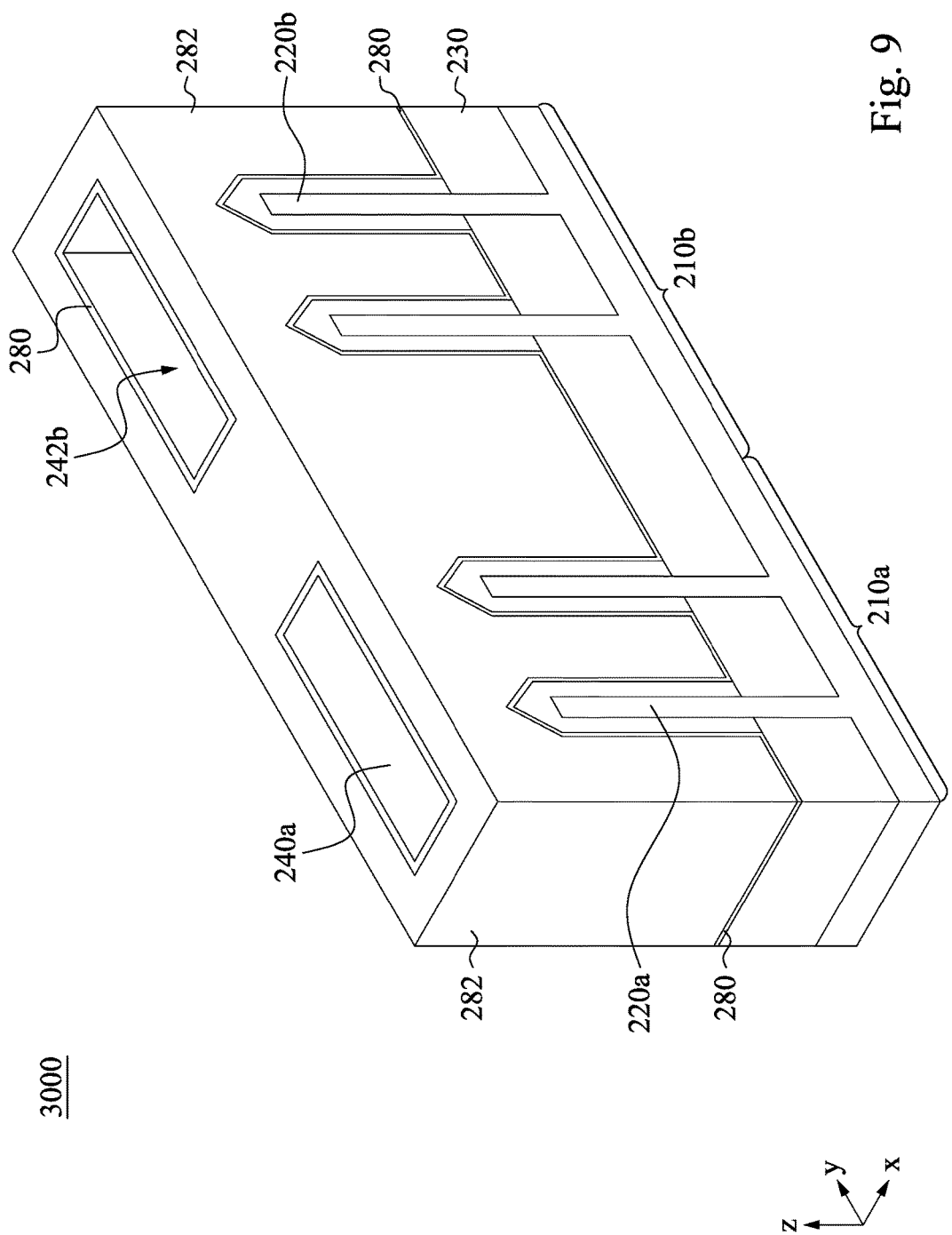
Figure 10A:
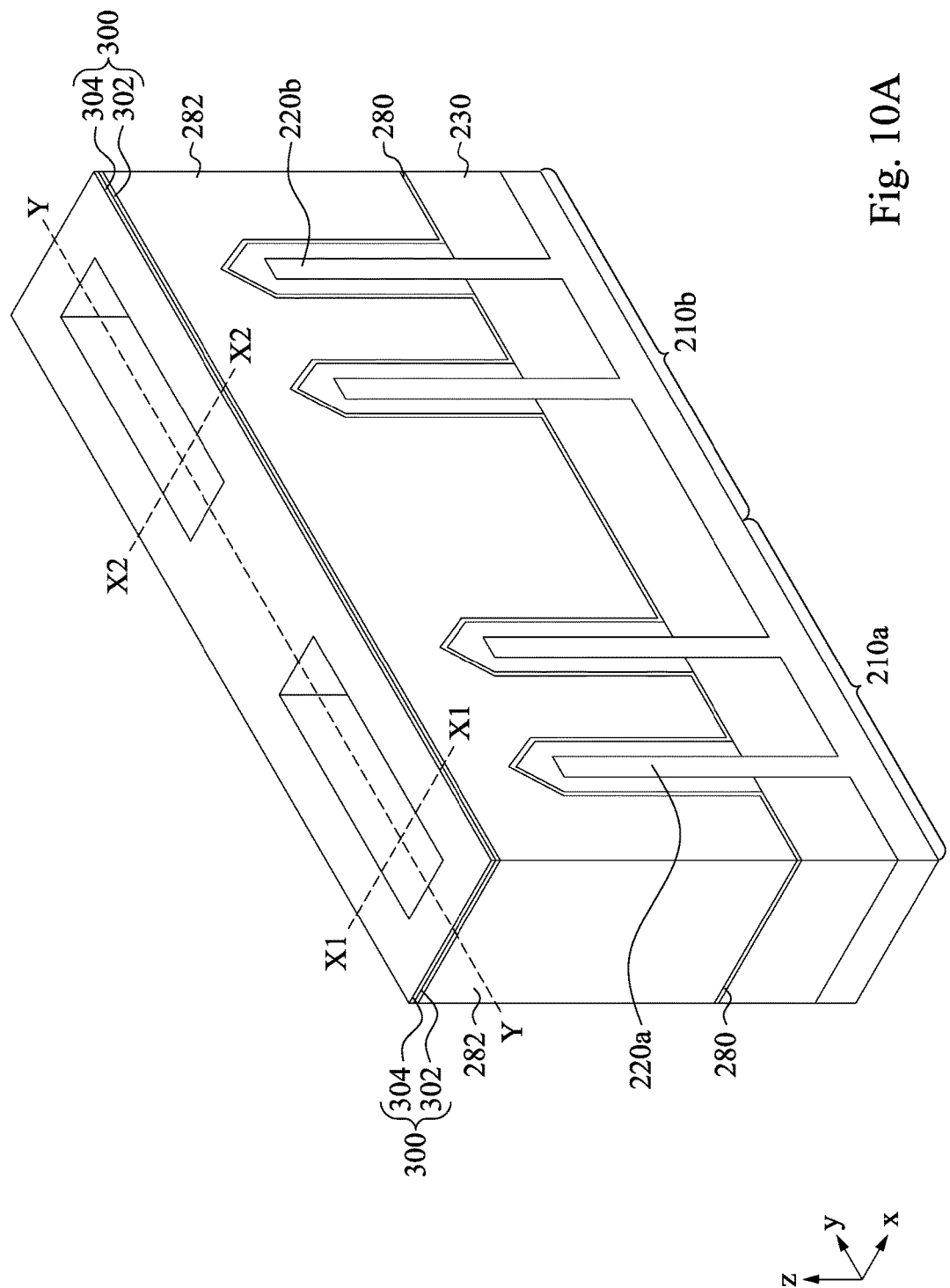
Figure 10B:
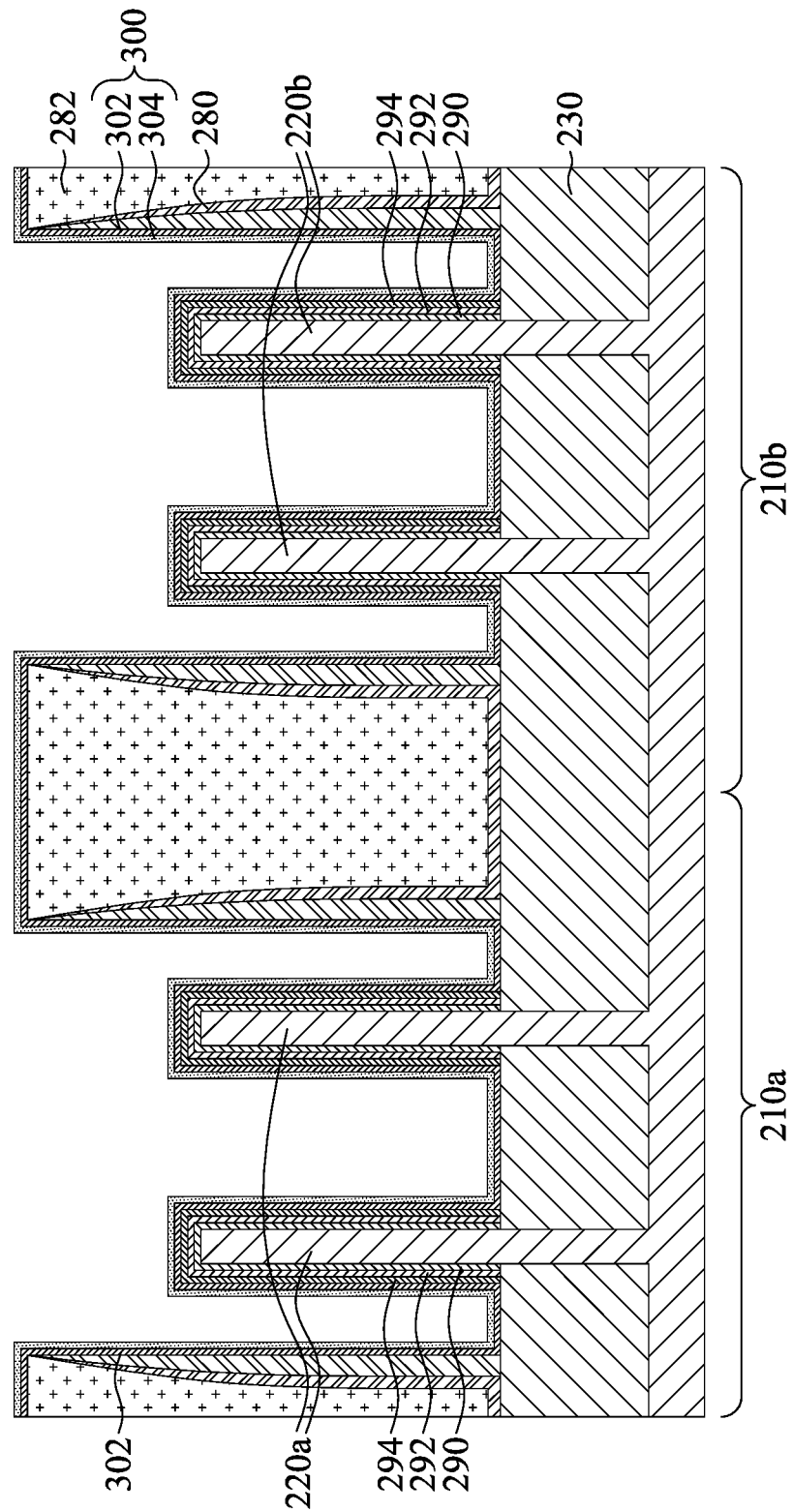
Figure 10C:
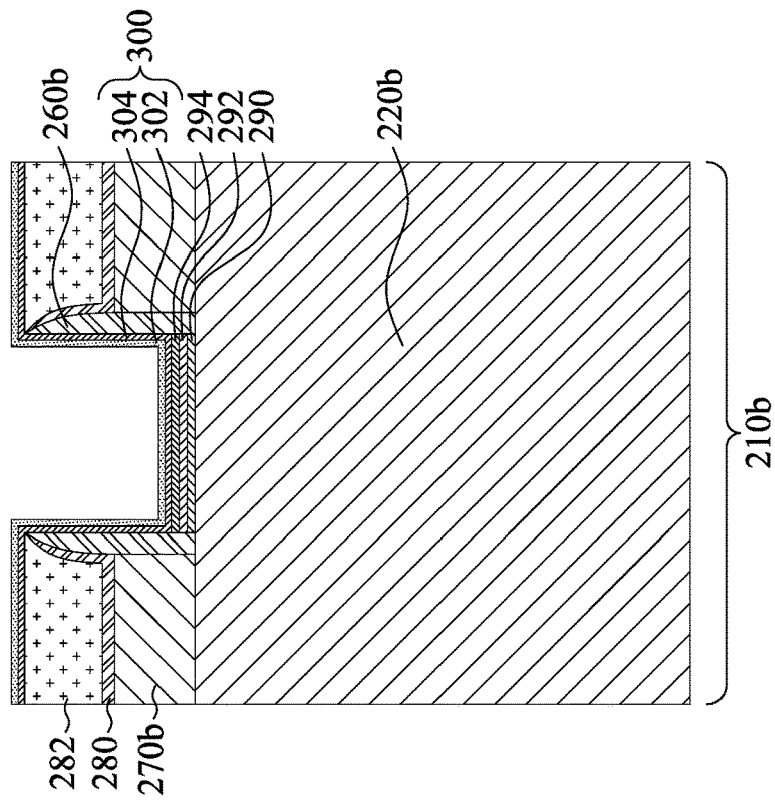
Figure 10D:
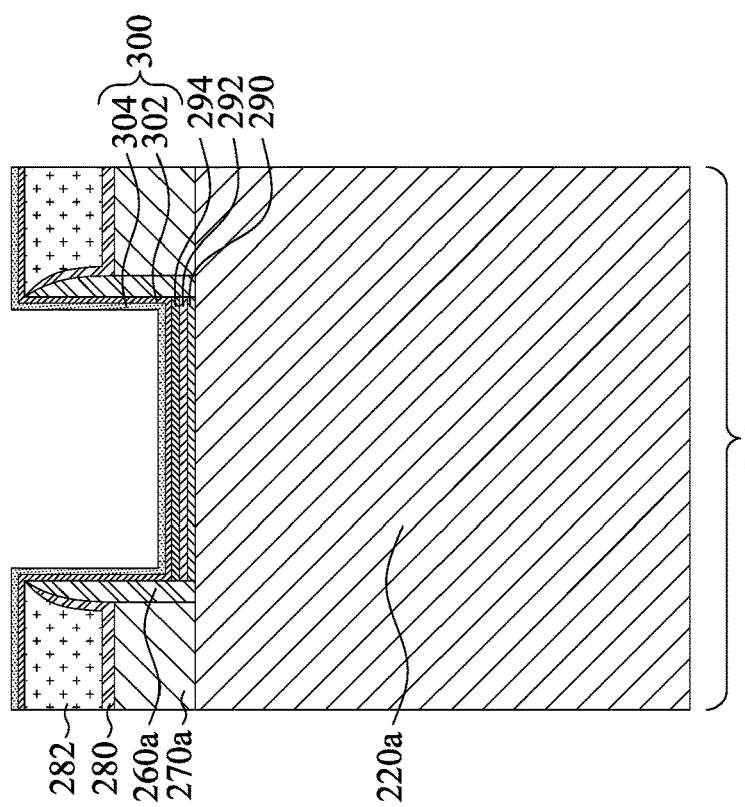
Figure 11A:
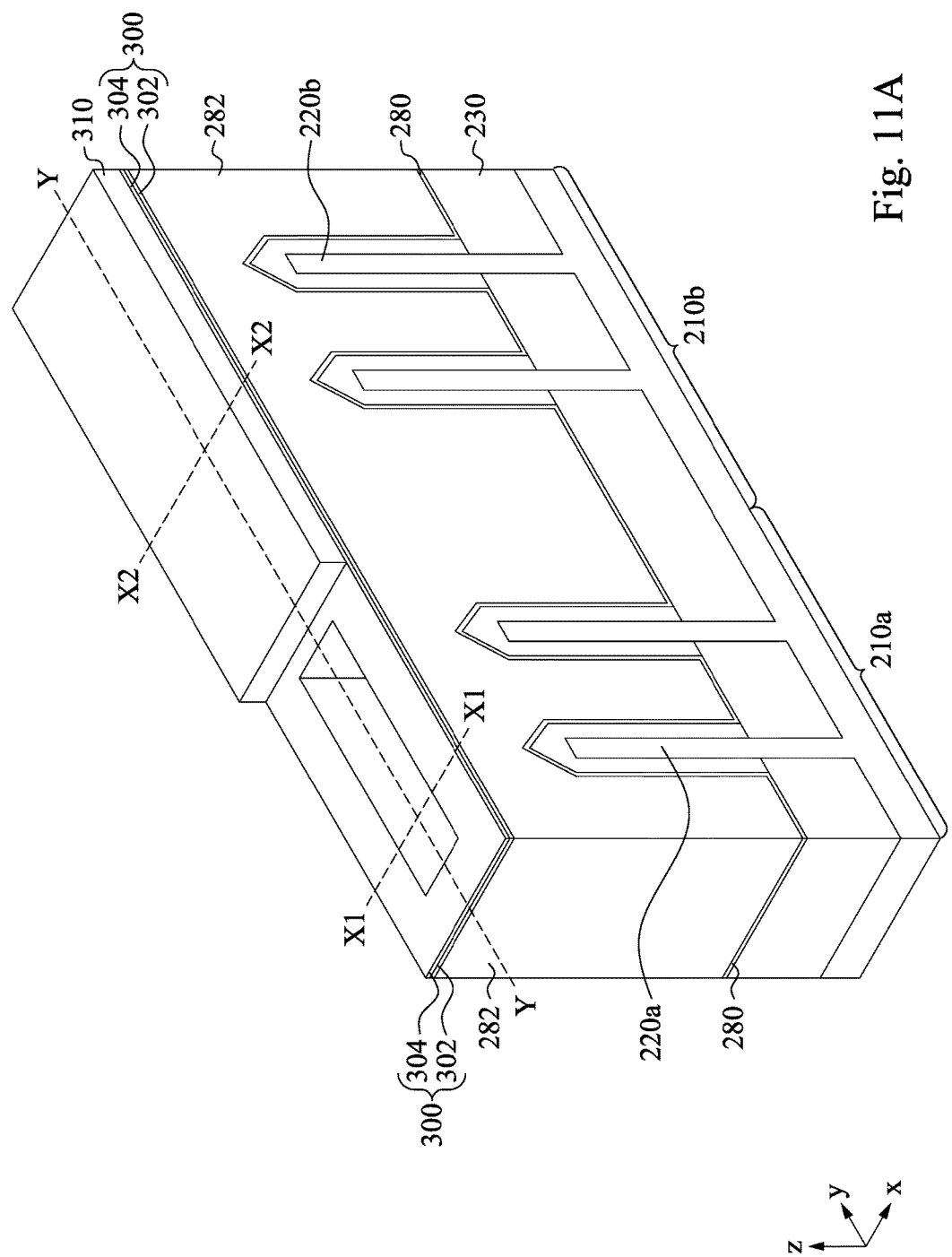
Figure 11B:
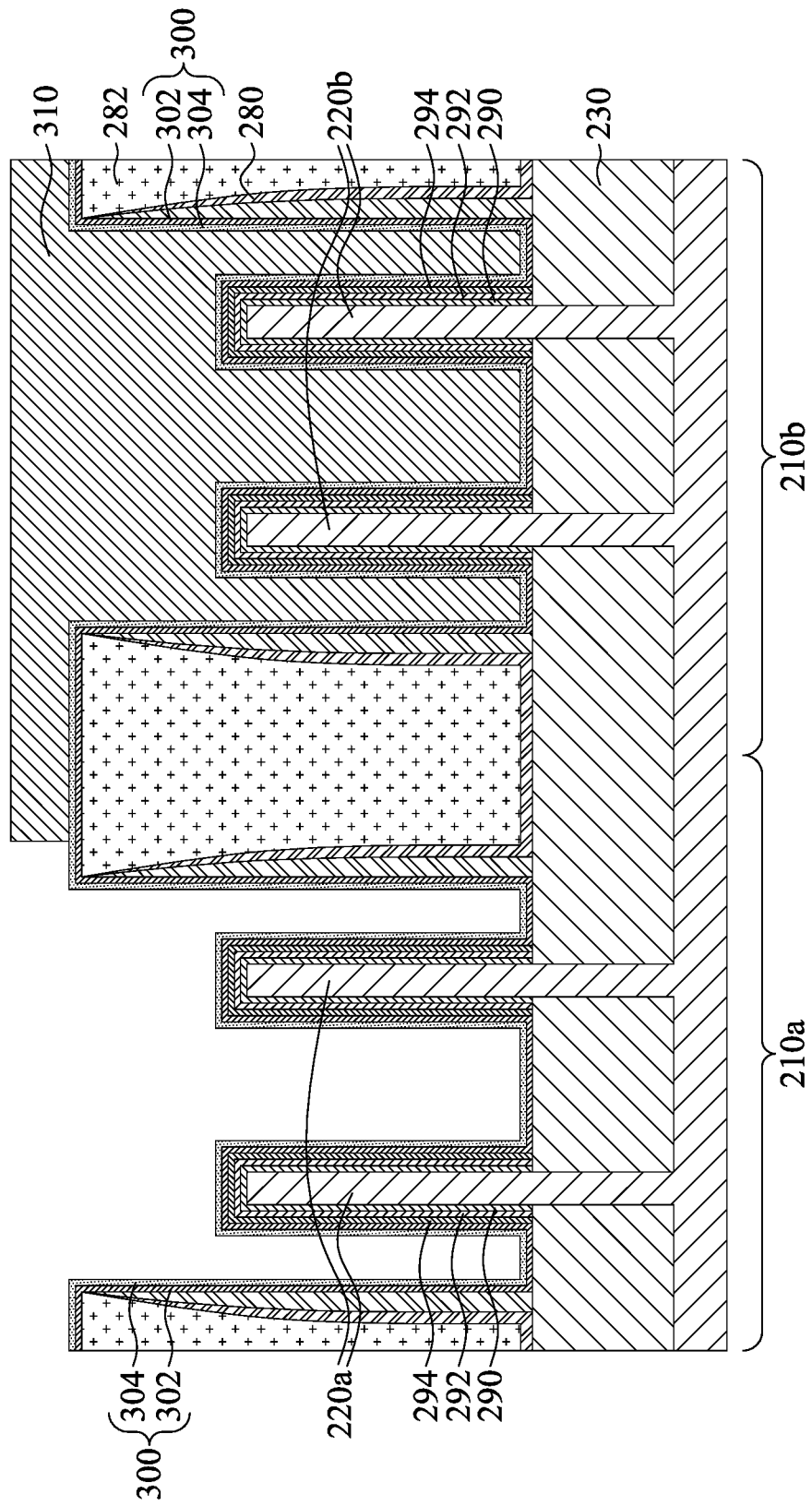
Figure 11D:
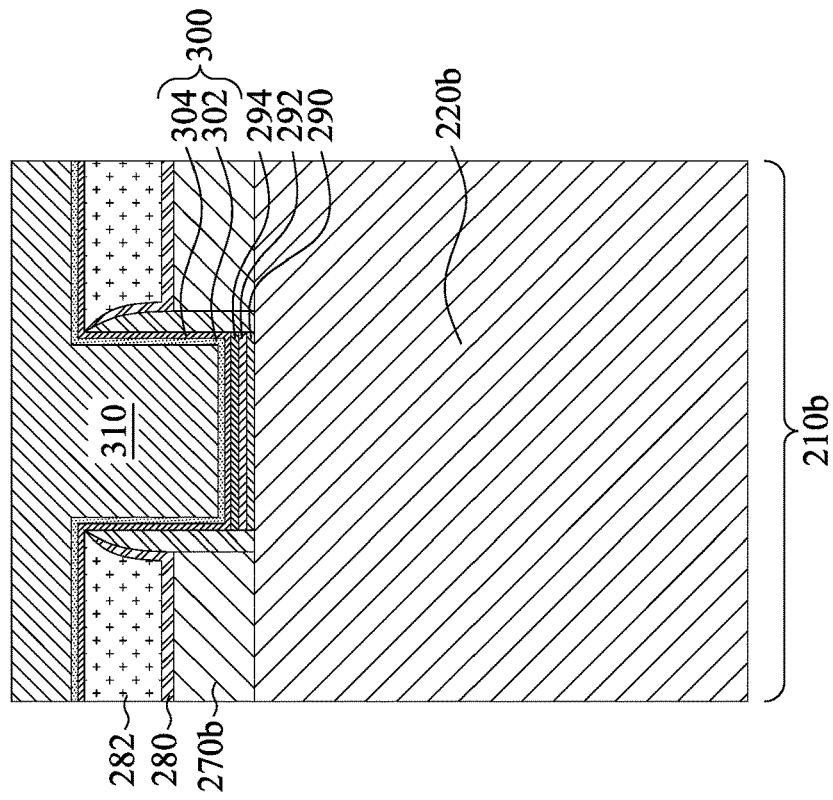
Figure 11C:
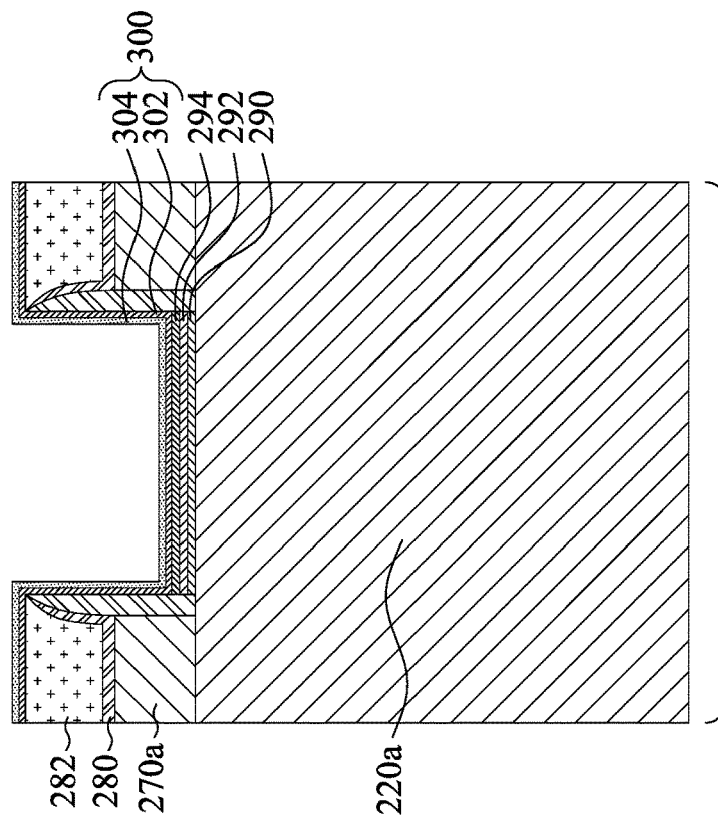
Figure 12A:
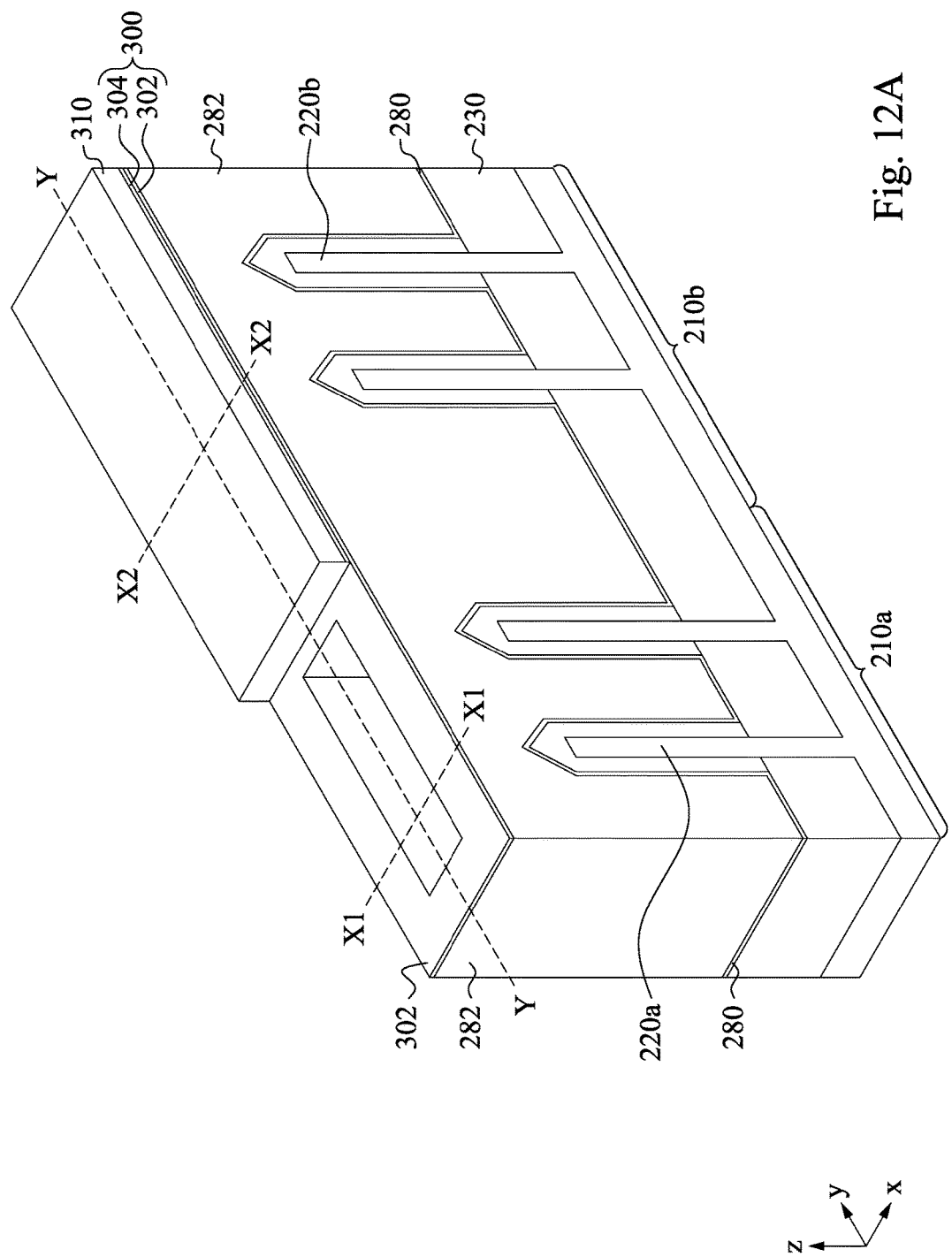
Figure 12B:
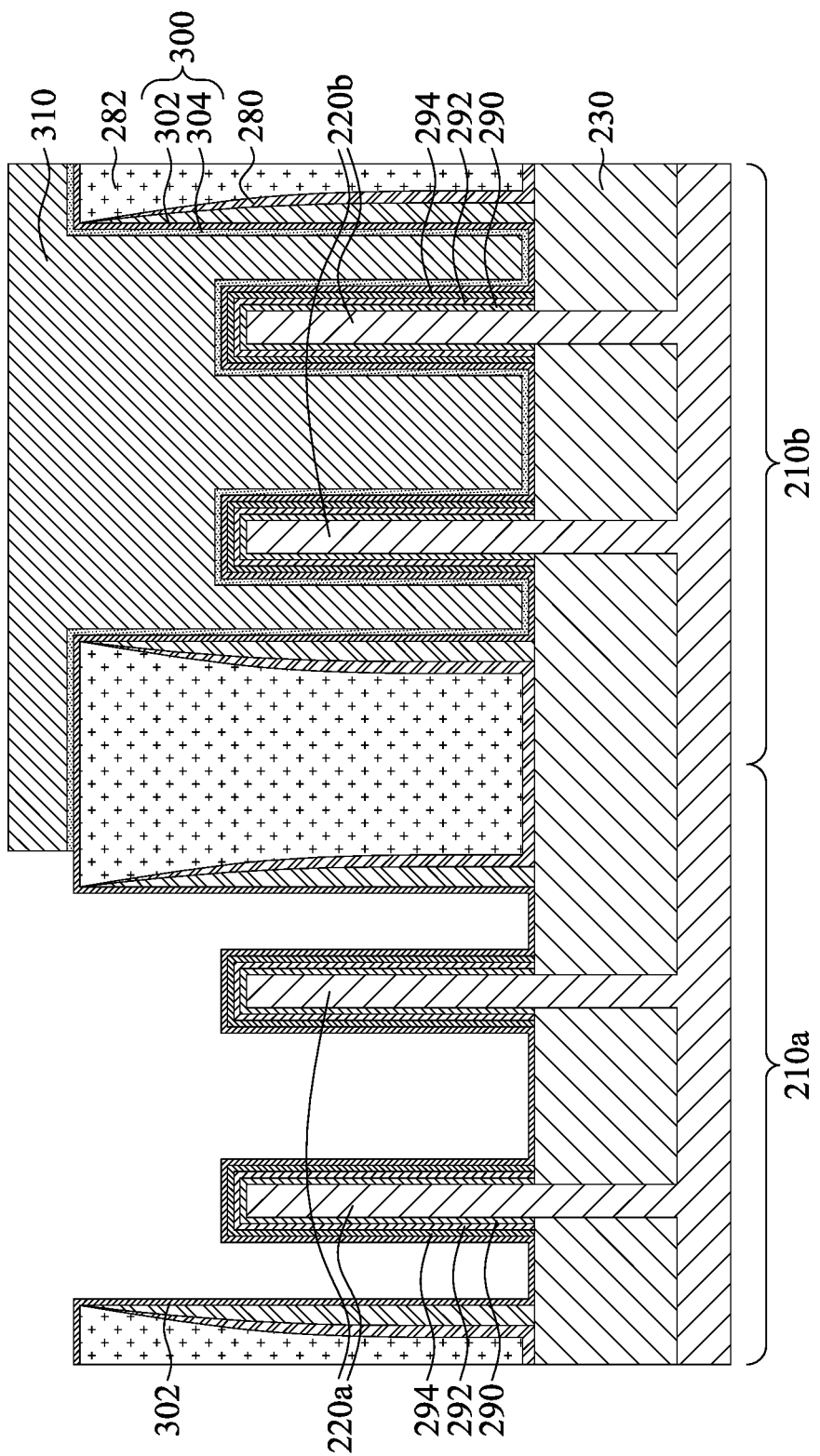
Figure 12D:
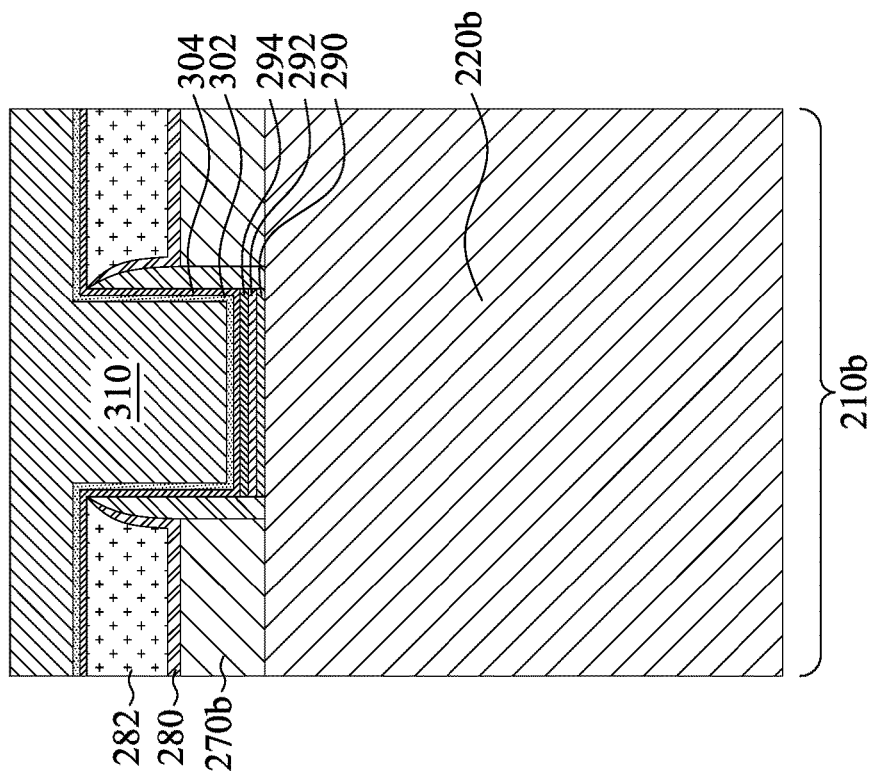
Figure 12C:
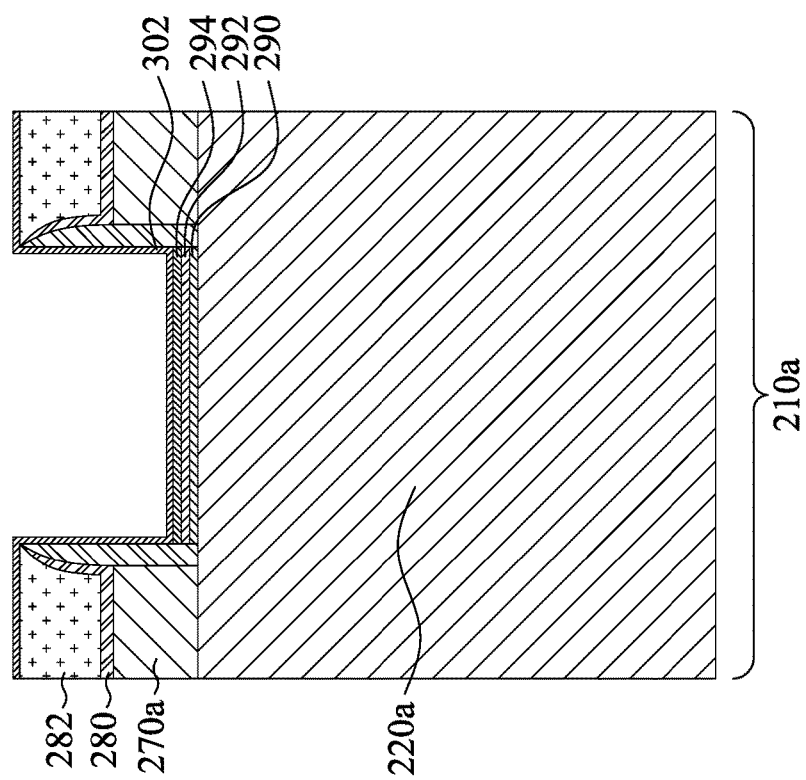
Figure 13A:
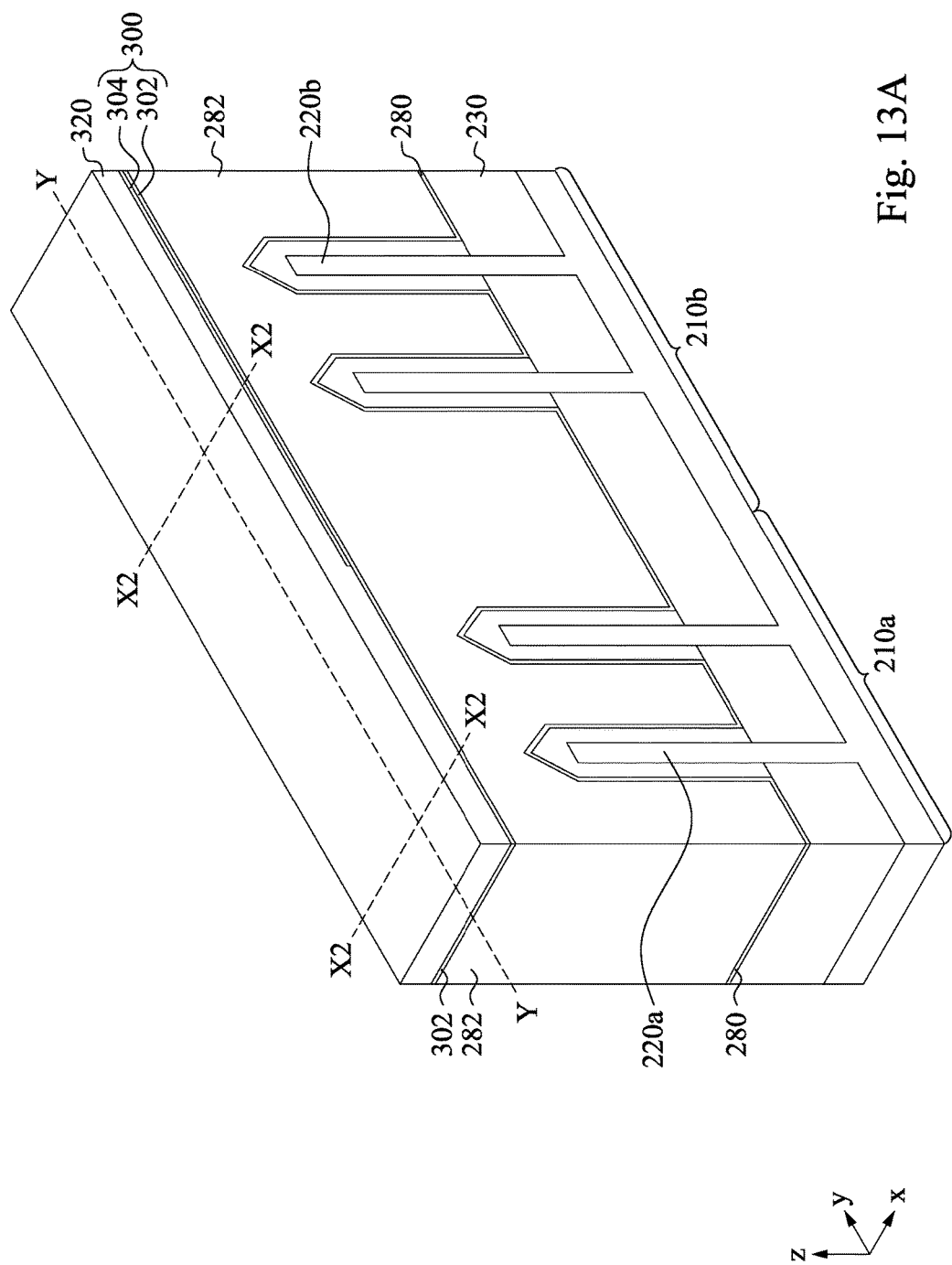
Figure 13B:
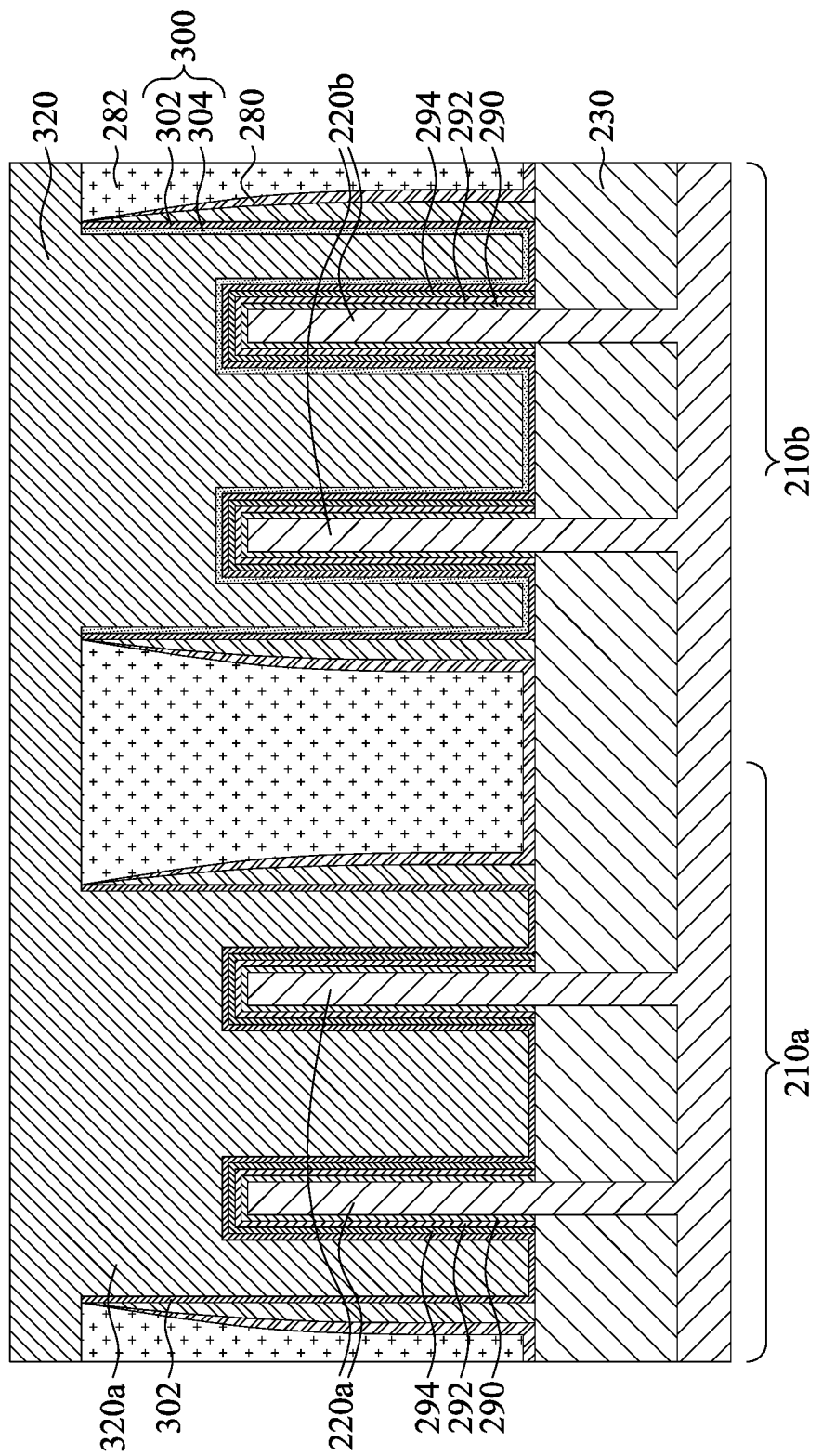
Figure 13D:
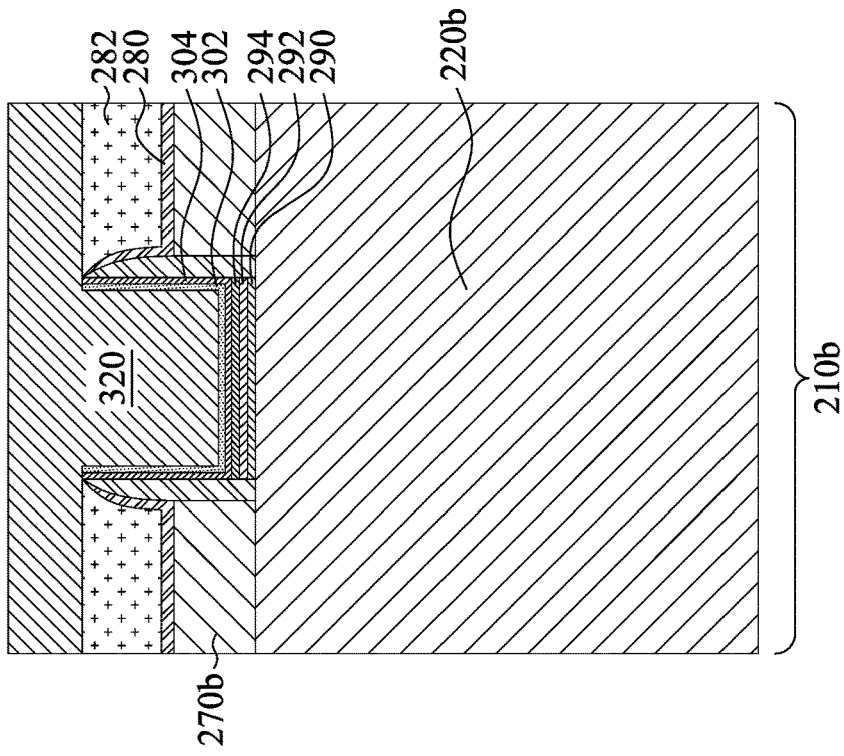
Figure 13C:
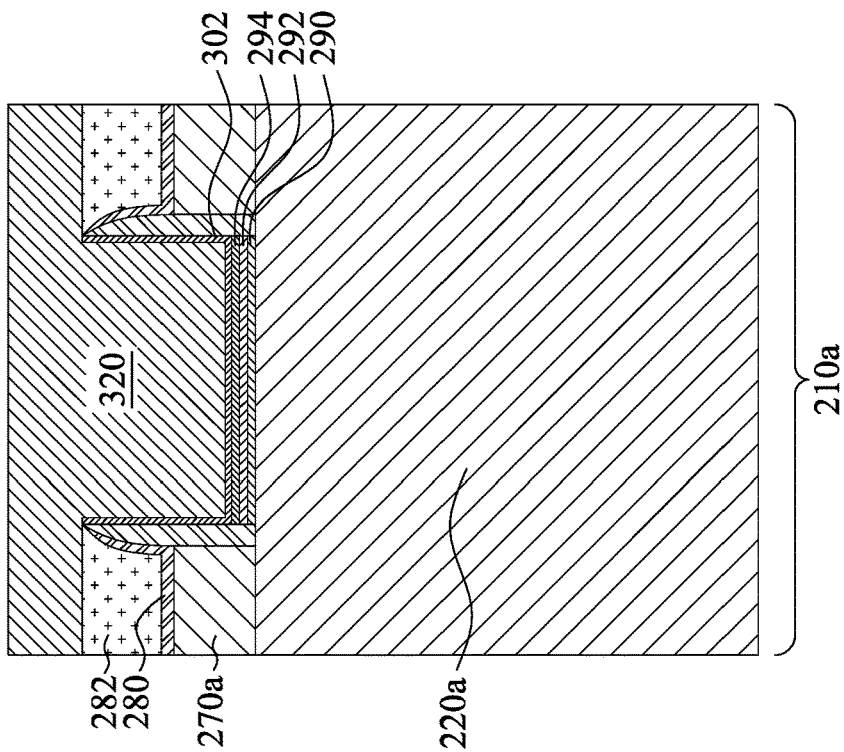

Reference is made to FIG. 9. In other embodiments, the second dummy gate 240b is removed, while the first dummy gate 240a is retained. In some embodiments, the first dummy gate 240a may be removed, and the second dummy gate 240b may be retained. The removal of one of the first dummy gate 240a and the second dummy gate 240b is to provide more flexible, for example, asymmetric arrangement of integrated circuit layout. The following operations 18 to 24 may be performed on the semiconductor configuration shown in FIGS. 8A to 8D and FIG. 9. After completing all of the operations in FIG. 1, the semiconductor configuration shown in FIG. 8A may form a semiconductor device 2000 shown in and FIGS. 14A to 14D, and the semiconductor configuration shown in FIG. 9 may form a semiconductor device which is similar to the semiconductor device 2000 except a gate structures 320a is replaced by the first dummy gate 240a.

Reference is made to FIGS. 10A-10D. A capping metal layer 300 is formed on the ferroelectric layer 294 (operation 20 of FIG. 1). As shown in FIGS. 10A-10D, the capping metal layer 300 may include a barrier metal layer 302 and a work function metal layer 304 on the barrier metal layer 302. The barrier metal layer 302 may include titanium nitride (TiN), tantalum nitride (TaN), or composite layers thereof. In some embodiments, the barrier metal layer 302 is a multi-layer structure. For example, the barrier metal layer 302 may include a TiN layer (lower part of barrier metal layer 302) and a TaN layer (upper part of barrier metal layer 302) over the TiN layer. In some embodiments, the barrier metal layer 302 is formed by deposition techniques such as ALD, CVD or PVD. The work function tuning metal layer 304 may include Al, W, Cu, Au, Pt or other suitable metal materials. In some embodiments, the work function metal is formed by ALD, CVD, PVD or the like.

Reference is still made to FIGS. 10A-10D. A post annealing process is performed (operation 22 of FIG. 1). The post annealing process is carried out to drive the crystalline transition of the ferroelectric layer 294. According to some embodiments, the crystalline transition of the ferroelectric layer 294 may be divided into three stages, including an initial amorphous phase, then to a high-temperature tetragonal phase, and to a high-pressure ferroelectric orthorhombic phase. Capping metal layer 300 provides the mechanical stress needed for the crystalline transition from the high-temperature tetragonal phase to the high-pressure ferroelectric orthorhombic phase during cooling. In some embodiments, the post annealing process is performed by spike annealing or soak annealing at temperature ranging from about 400° C. to 1000° C.

In some embodiments, after the post annealing process, a second monitoring process is performed to inspect or monitor the ferroelectricity of the ferroelectric layer 294. The second monitoring process is similar to the first monitoring process, and the second monitoring process detects whether the ferroelectric layer 294 is transformed, for example, from the high-temperature tetragonal phase to the high-pressure ferroelectric orthorhombic phase.

As shown in FIGS. 11A-11D through 12A-12D, an N/P patterning process is performed according to some embodiments. Referring to FIGS. 11A-11D, a hard mask layer 310 is formed over the second fins 220b to protect the work function metal layer 304 of the p-type gate structure in the second active region 210b. In some embodiments, the hard masks layer 310 may include silicon nitride or silicon oxide, for example. Subsequently, referring to FIGS. 12A-12D, the work function metal layer 304 in the first active region 210a is removed to expose the underlying barrier metal layer 302. In some embodiments, the work function metal layer 304 in the first active region 210a may be removed by a dry etch or a wet etch process. The capping metal layer 300, including the barrier metal layer 302 and the work function metal layer 304, is retained in the second active region 210b (over the p-type gate structure).

Reference is made to FIGS. 13A-13D, a metal gate electrode is formed on the ferroelectric layer 294 (operation 24 of FIG. 1). As shown in FIGS. 13A-13D, the hard mask layer 310 is removed, and the metal gate electrode layer 320 is formed on the ferroelectric layer 294 in the first active region 210a and second active region 210b.

Subsequently, as shown in FIGS. 14A-14D, a planarization process, for example, a CMP process is performed to remove the excess portions of the metal gate electrode layer 320 and the capping metal layer 300 according to some embodiments, and a semiconductor device 2000 is formed. The planarization process exposes the ILD layer 282, the barrier metal layer 302, and the work function metal layer 304. The n-type gate structure 320a in the first active region 210a and p-type gate structure 320b in the second active region 210b are then complete. The difference between the n-type and p-type gate structures 320a and 320b arises from the width of the gate and the work function metal layer 304. The n-type gate structure 320a in the first active region 210a has a wider gate width $W_1$, and the work function metal layer 304 is removed. The p-type gate structure 320b in the second active region 210b has a narrower gate width $W_2$ in comparison with the gate width $W_1$ (see FIGS. 14C and 14D), and the work function metal layer 304 remains on the barrier metal layer 302 in the second active region 210b.

Figure 15:
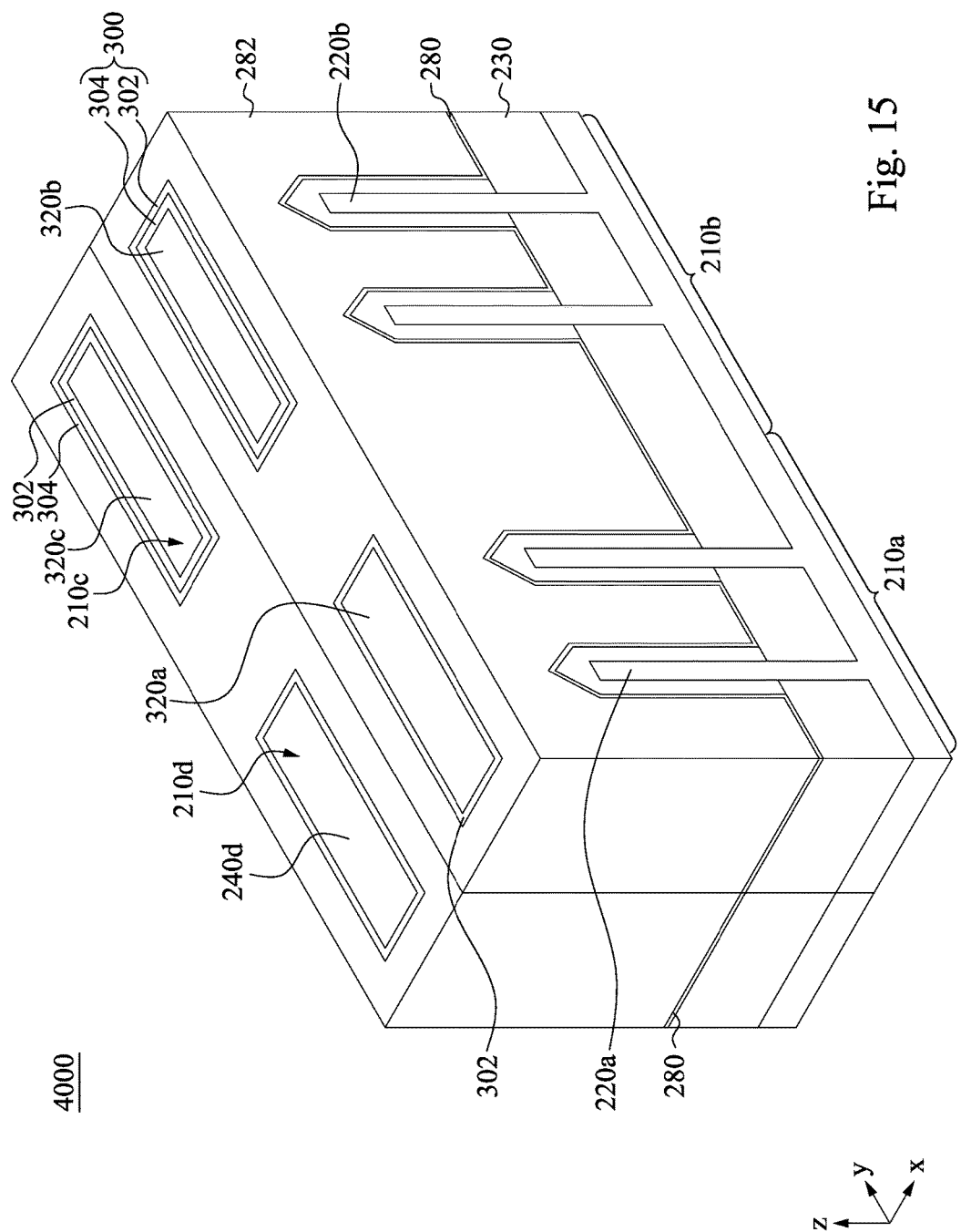

Reference is made to FIG. 15. A semiconductor device 4000 includes first fins 220a, second fins 220b, a first active region 210a, a second active region 210b, a third active region 210c and another region 210d. The formation of the semiconductor device 4000 is similar to the formation of the semiconductor device 2000. In operation 14, a first dummy gate 240a, a second dummy gate 240b, a third dummy gate 240c and a forth dummy gate 240d are formed. In operation 16, the first dummy gate 240a in the first active region 210a, the second dummy gate 240b in the second active region 210b, and the third dummy gate 240c in the third active region 210c are removed, while a forth dummy gate 240d is retained. After the removal of the first, the second, and the third dummy gates 240a, 240b, and 240c, the subsequent operations 18, 20, 22, and 24 are performed to form the semiconductor device 4000. The n-type gate structure 320a in the first active region 210a, and the p-type gate structures 320b and 320c in the second and the third active regions 210b and 210c are then complete. Retaining the forth dummy gate 240d is to provide more flexible, for example, asymmetric arrangement of integrated circuit layout. The n-type gate structure 320a in the first active region 210a has a wider gate width $W_1$, and the p-type gate structures 320b and 320c in the second and the third active region 210b and 210c have a narrower gate width $W_2$ in comparison with the gate width $W_1$.

FIGS. 16A to 19 are schematic drawings of various integrated circuit layouts in accordance with some embodiments of the instant disclosure.

Figure 16A:
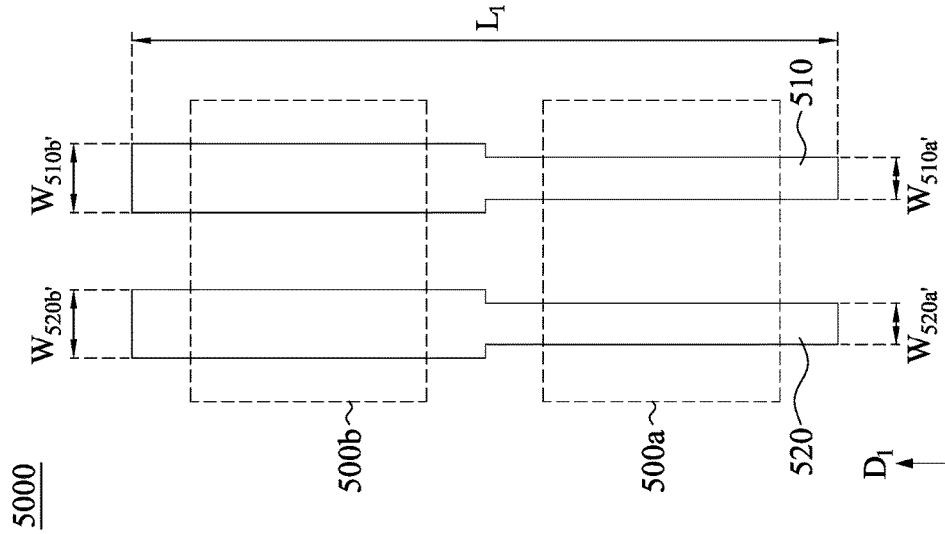
FIGS. 16A to 19 illustrate schematic integrated circuit layout in accordance with some embodiments of the instant disclosure.
Figure 16B:
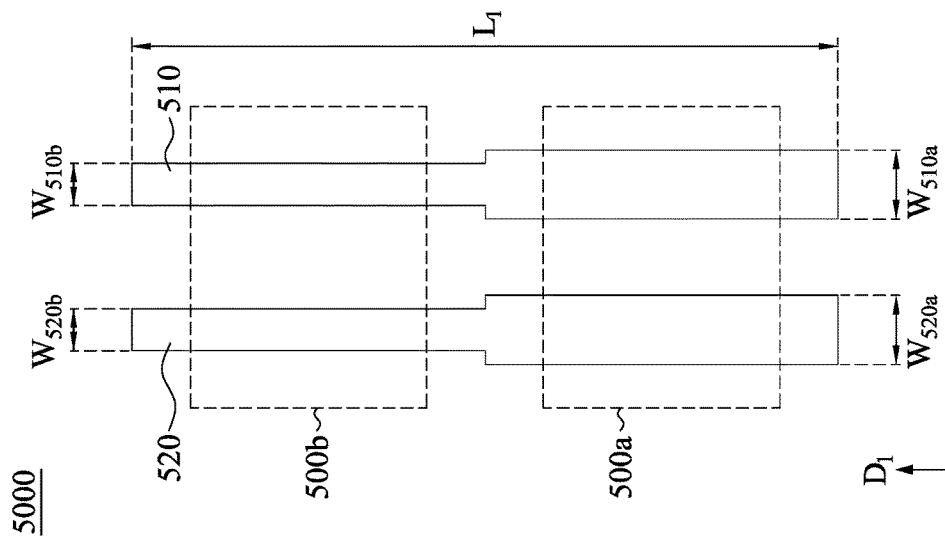

FIGS. 16A and 16B illustrate examples of integrated circuit 5000 in accordance with some embodiments of the instant disclosure. As shown in FIGS. 16A and 16B, an integrated circuit 5000 includes a first active region 500a, a second active region 500b, a first gate structure 510 and a second gate structure 520. The first active region 500a is electrically isolated from the second active region 500b. The first gate structure 510 and the second gate structure 520 extend along a first direction $D_1$ with a first gate length $L_1$ traversing the first active region 500a and the second active region 500b. The first gate structure 510 has a first gate width $W_{510a}$ in the first active region 500a measured along a second direction $D_2$ and a second gate width $W_{510b}$ in the second active region 500b measured along the second direction $D_2$. The second direction $D_2$ is substantially perpendicular to the first direction $D_1$. The second gate structure 520 has a third gate width $W_{520a}$ in the first active region 500a measured along the second direction $D_2$ and a fourth gate width $W_{520b}$ in the second active region 500b measured along the second direction $D_2$.

Figure 14A:
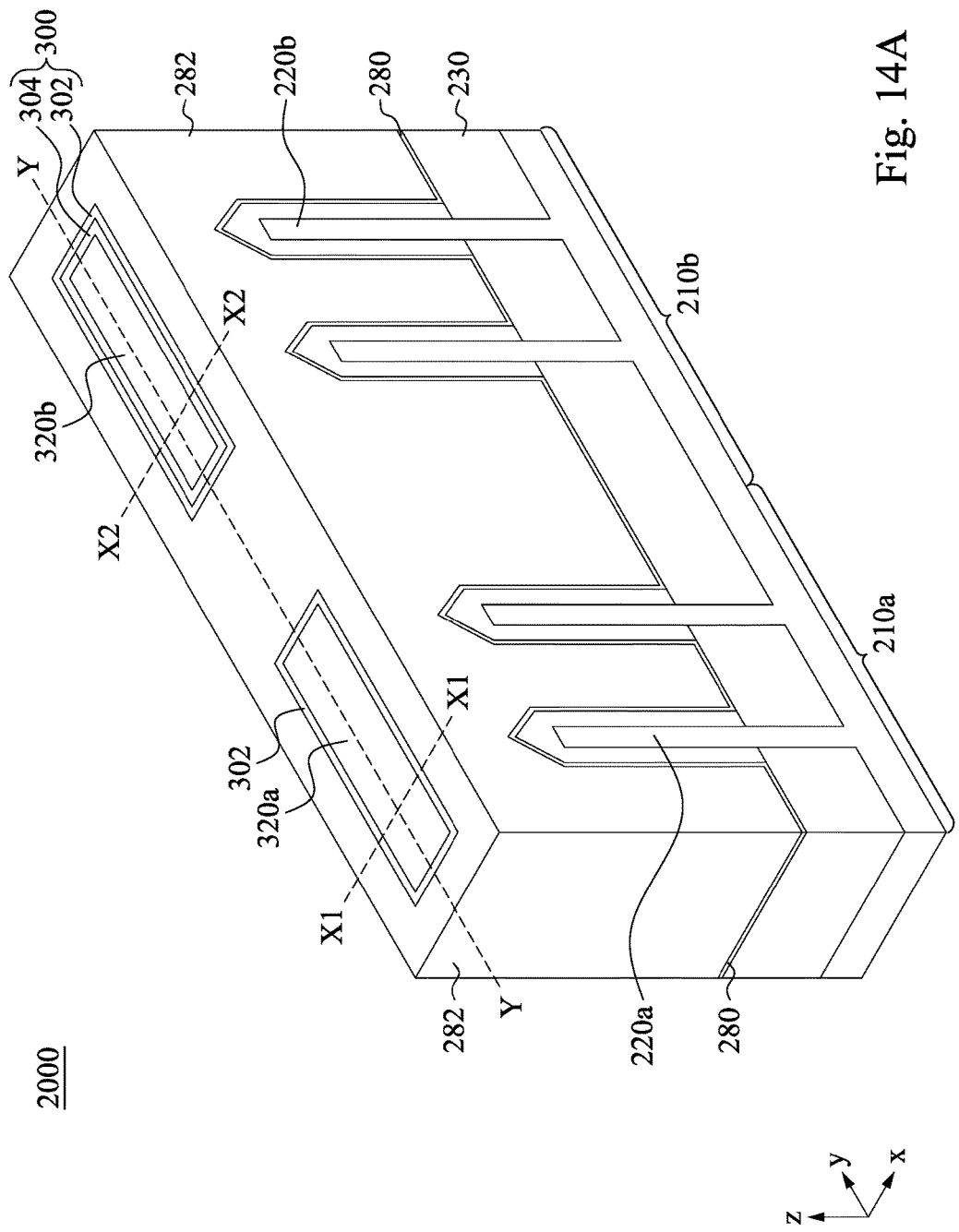
Figure 14B:
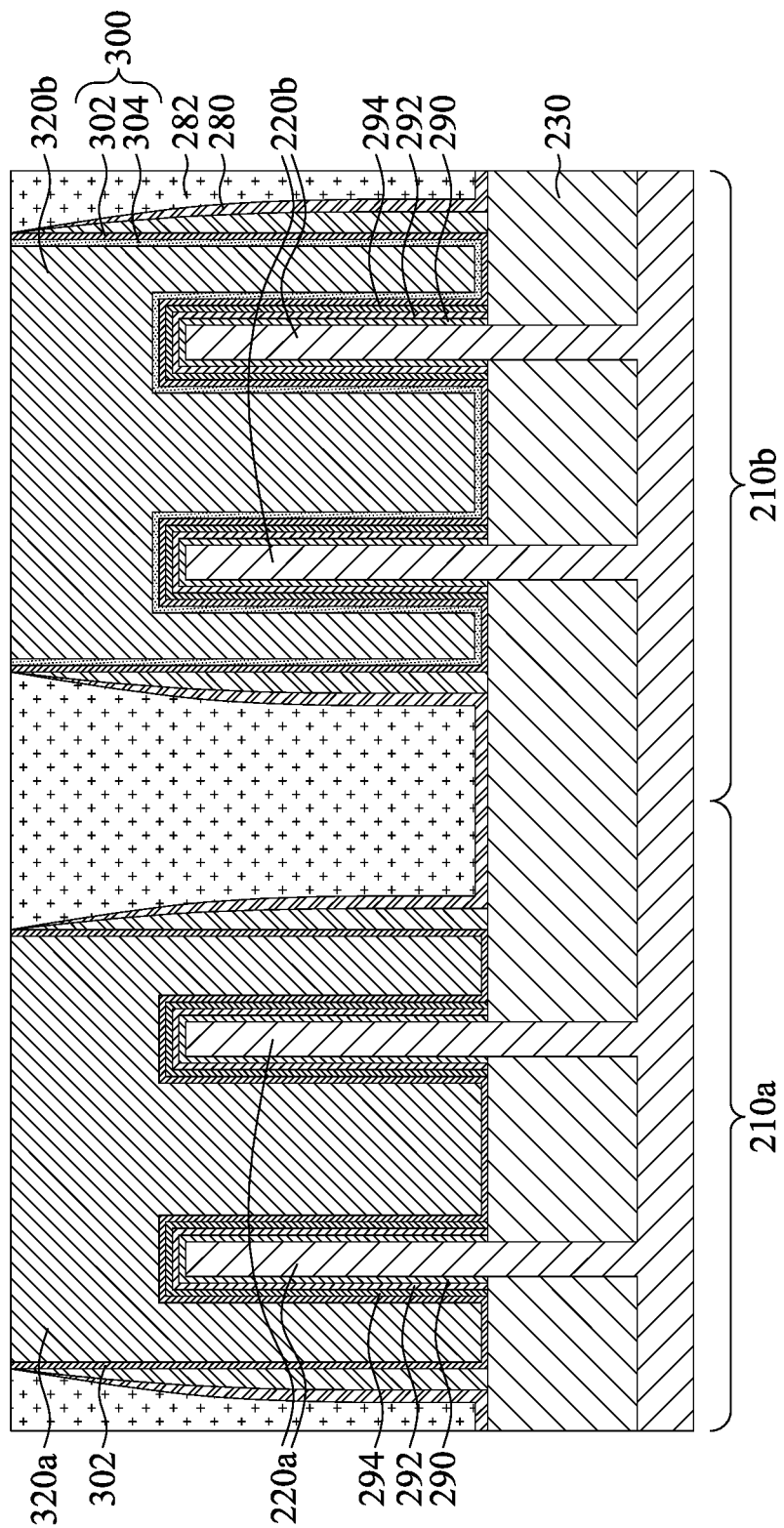
Figure 14D:
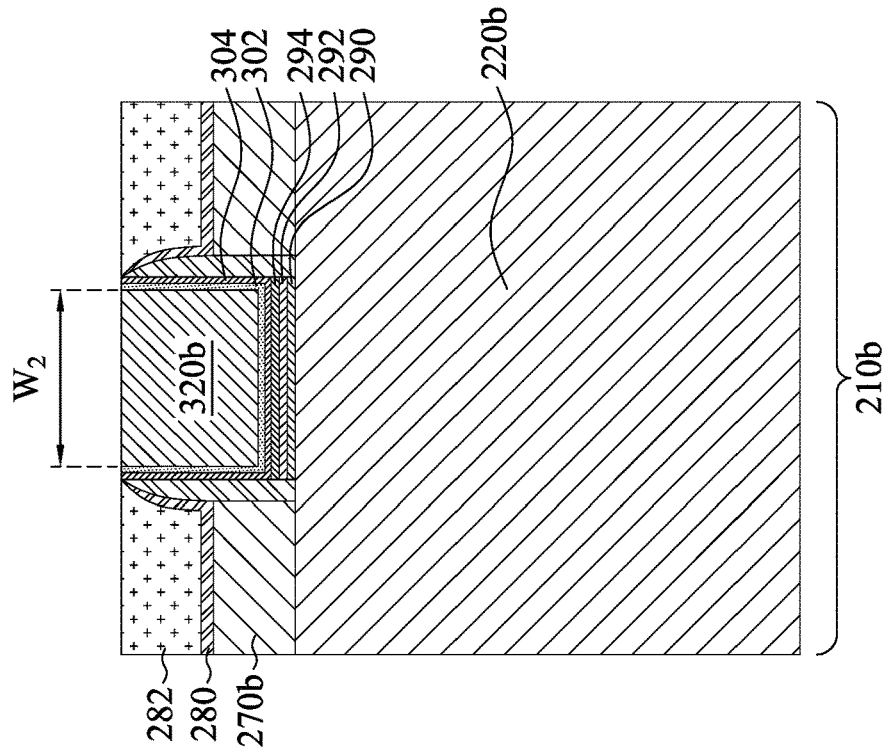
Figure 14C:
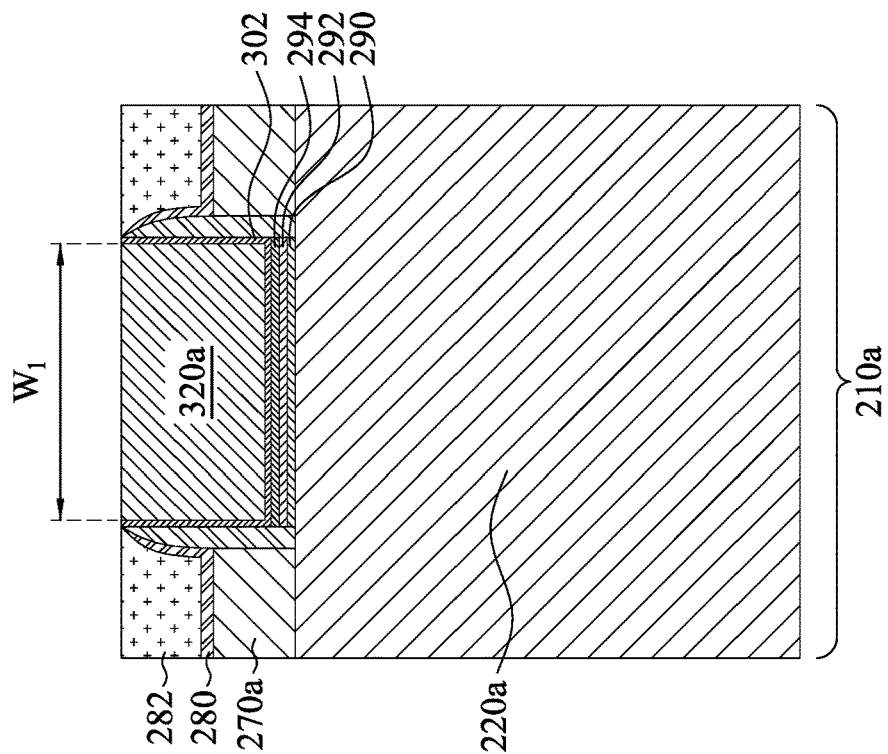

In some embodiments, the first gate width $W_{510a}$ is greater than the second gate width $W_{510b}$, and the third gate width $W_{520a}$ is greater than the fourth gate width $W_{520b}$ (FIG. 16A). In some embodiments, the first gate width $W_{510a}$ may be different to the third gate width $W_{520a}$, and the second gate width $W_{510b}$ may be different to the fourth gate width $W_{520b}$. This gate layout shown in FIG. 16A can be translated to the gate configuration shown in FIGS. 14A-14D. In FIGS. 14C and 14D, the metal gate electrode 320a has a gate width $W_1$ in the first active region 210a measured along the x direction and the metal gate electrode 320b has a gate width $W_2$ in the second active region 210b measured along the x direction. The gate width $W_1$ is greater than the gate width $W_2$ due to the photolithography and the patterning process (see FIG. 4 and FIG. 5). In one lane (i.e., parallel to the first direction $D_1$) the gate width is varied across different active regions, and therefore the layout design has a greater flexibility and provides an easier method to slightly modify Vt of the device.

In other embodiments, as shown in FIG. 16B, the first gate width $W_{510a'}$ is shorter than the second gate width $W_{510b'}$, and the third gate width $W_{520a'}$ is shorter than the fourth gate width $W_{520b'}$. In some embodiments, the first gate width $W_{510a'}$ may be different to the third gate width $W_{520a'}$, and the second gate width $W_{510b'}$ may be different to the fourth gate width $W_{520b'}$. In some embodiments, the first active region 500a may be NMOS and the second active region 500b may be PMOS. In other embodiments the first active region 500a may be PMOS and the second active region 500b may be NMOS. In some embodiments, the first gate structure 510 and the second gate structure 520 may be fin structure. In other embodiments, the first gate structure 510 and the second gate structure 520 may be planar.

Figure 17A:
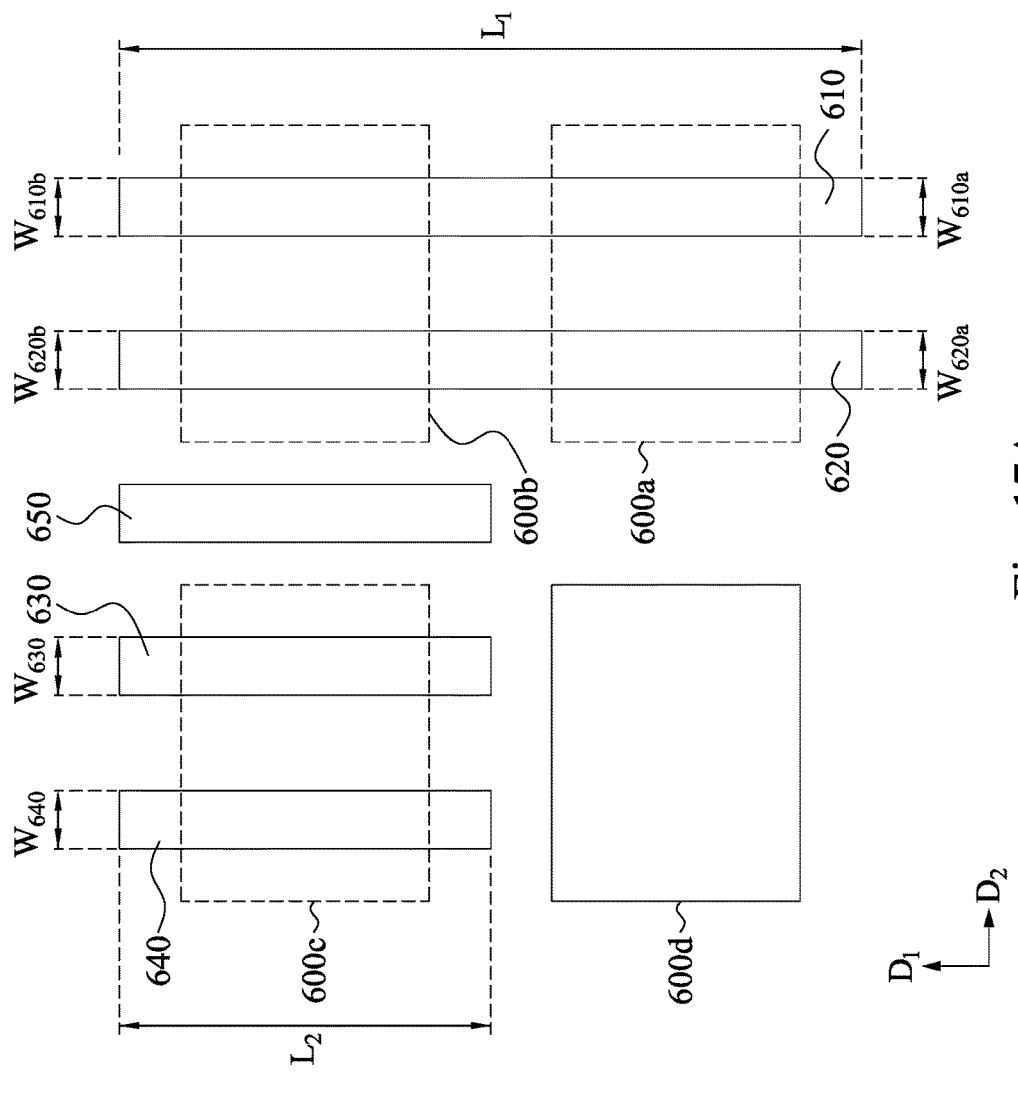
Figure 17B:
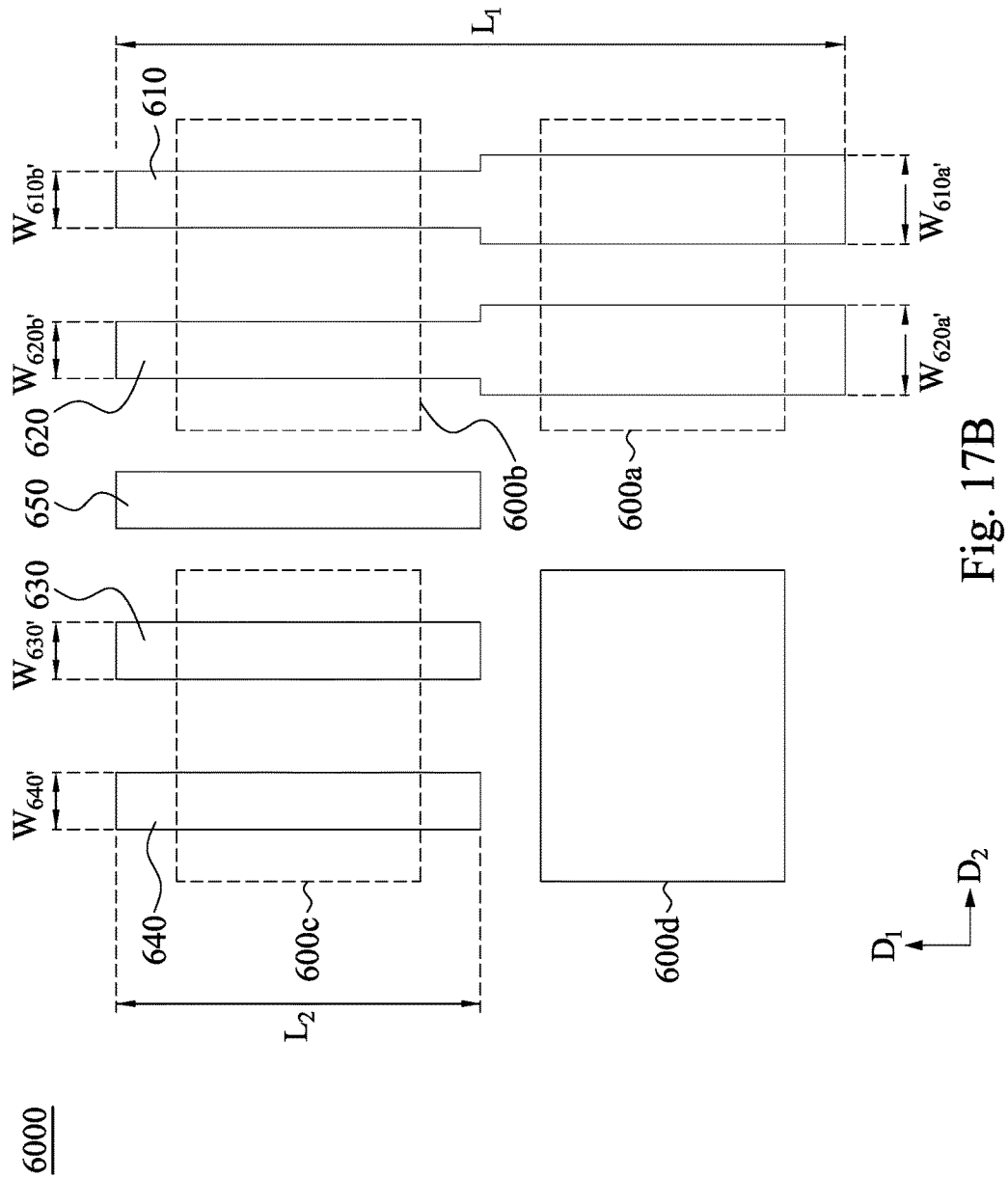

Reference is made to FIGS. 17A and 17B, illustrating examples of integrated circuit layout 6000. In FIGS. 17A and 17B, the integrated circuit layout 6000 includes a first active region 600a, a second active region 600b, a third active region 600c, a dummy gate 600d, a first gate structure 610, a second gate structure 620, a third gate structure 630, a fourth gate structure 640, and a fifth gate structure 650. The first active region 600a, the second active region 600b, and the third active region 600c are electrically isolated from each other. The first and third active regions 600a and 600c are arranged at different sides of the second active regions 600b. The dummy gate structure 600d is disposed on the diagonal corner of the second active region 600b and next to the first and third active regions 600a and 600c. The first gate structure 610 and the second gate structure 620 extend along the first direction $D_1$ with a first gate length $L_1$ traversing across the first active region 600a and the second active region 600b. The third gate structure 630 and the fourth gate structure 640 extend along the first direction $D_1$ with a second gate length $L_2$ traversing across the third active region 600c. The fifth gate width structure 650 extends along the first direction $D_1$, and separates the second active region 600b from the third active region 600c.

In some embodiments, the first gate length $L_1$ is greater than the second gate length $L_2$. The integrated circuit layout 6000 shown in FIGS. 17A and 17B can be translated to the gate configuration shown in FIG. 15. The first active region 600a, the second active region 600b, the third active region 600c, and the dummy gate 600d in FIGS. 17A and 17B may be corresponding to the first active region 210a, the second active region 210b, the third active region 210c, and the dummy gate 240d in FIG. 15. The dummy gate 240d retained in the operation 16 blocks the subsequent layers forming on the fourth fins in the region 210d, resulting in the difference of the gate length, and the first length $L_1$ is greater than the second length $L_2$.

In some embodiments, as shown in FIG. 17A, the first, the second, the third and the fourth gate structures 610, 620, 630, and 640 has the same gate width, that is, the gate widths $W_{610a}$, $W_{610b}$, $W_{620a}$, $W_{620b}$, $W_{630}$, and $W_{640}$ may be equal. In other embodiments, as shown in FIG. 17B, gate width $W_{610a'}$ is greater than gate width $W_{610b'}$, and gate width $W_{620a'}$ is greater than gate width $W_{620b'}$. In other embodiments, the gate widths $W_{610a''}$, $W_{610b''}$, $W_{620a''}$, $W_{620b''}$, $W_{630'}$, and $W_{640'}$ may be different from each other. In some embodiments, the gate structures 710, 720, 730, 740, 750 and 760 may be fin structure. In other embodiments, the gate structures 710, 720, 730, 740, 750 and 760 may be planar.

Figure 18:
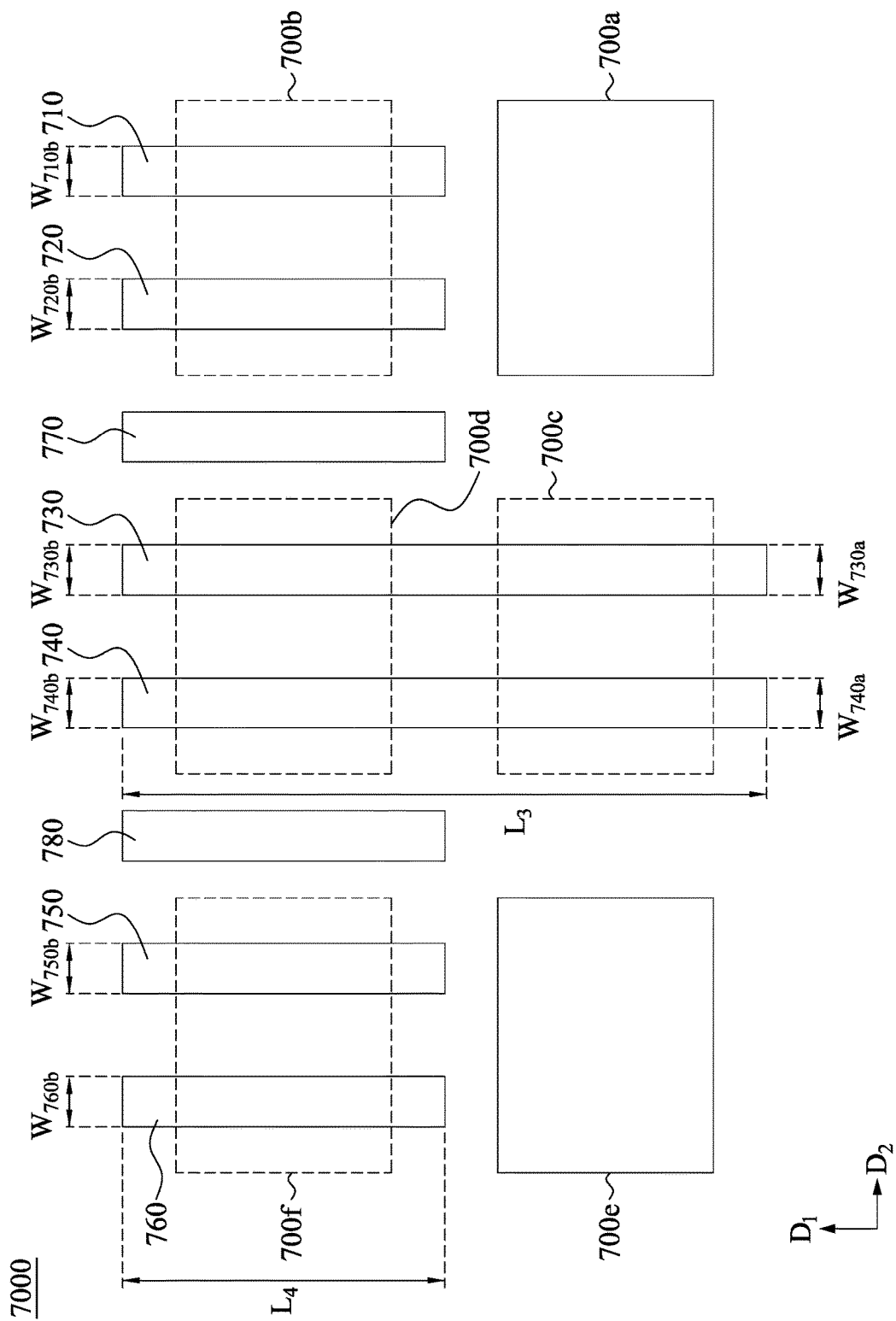

Referring to FIG. 18, illustrating an integrated circuit layout 7000 in accordance with some embodiments of the instant disclosure. As shown in 18, the integrated circuit layout 7000 includes active regions 700b, 700c, 700d and 700f, dummy gates 700a and 700e, and gate structures 710, 720, 730, 740, 750, 760, 770, and 780. The active regions 700b, 700c, 700d, and 700f are electrically isolated from each other. The active regions 700f, 700d and 700b are arranged in sequence along the second direction $D_2$. The dummy gate 700e, the active region 700c and the dummy gate 700a are arranged in sequence along the second direction $D_2$ and next to the active regions 700f, 700d, and 700b, respectively. The dummy gate 700e is disposed in a corner of the integrated circuit layout 7000, and the active regions 700f and 700c are arranged at different sides of the dummy gate 700e. The dummy gates 700a and 700e are disposed on two opposite sides of the active region 700c, and the active regions 700b and 700c are disposed at two different sides of the dummy gate 700a. The gate structures 730 and 740 extend along the first direction $D_1$ with a third gate length $L_3$ traversing across the active regions 700c and 700d. The gate structures 710 and 720 extend along the first direction $D_1$ with a fourth gate length $L_4$ traversing across the active region 700b. The gate structures 750 and 760 extend along the first direction $D_1$ with a fourth gate length $L_4$ traversing across the active region 700f. In some embodiments, the third gate length $L_3$ is greater than the fourth gate length $L_4$. In some embodiments, the gate widths $W_{710}$, $W_{720}$, $W_{730a}$, $W_{730b}$, $W_{740a}$, $W_{740b}$, $W_{750b}$, and $W_{760b}$ may be equal. In other embodiments, the gate width $W_{730b}$ may be different from the gate width $W_{730a}$, and the gate width $W_{740b}$ may be different from gate width $W_{740a}$.

Figure 19:
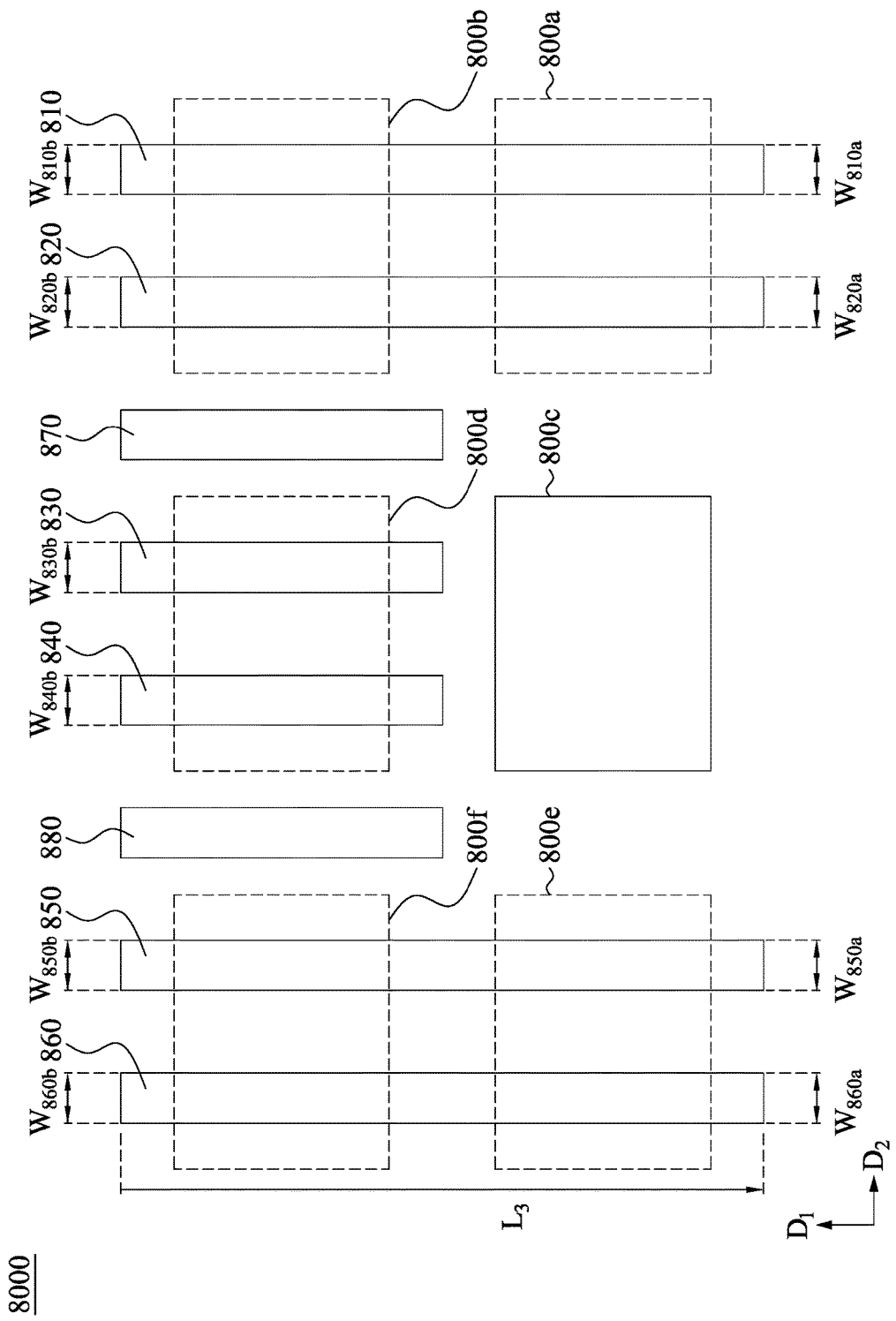

Reference is made to FIG. 19, illustrating an integrated circuit layout 8000 in accordance with some embodiments of the instant disclosure. The integrated circuit layout 8000 is similar to the integrated circuit layout 7000. The integrated circuit layout 8000 includes active regions 800a, 800b, 800d, 800e, and 800f, dummy gate 800c, and gate structures 810, 820, 830, 840, 850, 860, 870, and 880. The active regions 800a, 800b, 800d, 800e, and 800f may be electrically isolated from each other. The active regions 800f, 800d and 800b are arranged in sequence along the second direction $D_2$. The active region 800e, the dummy gate 800c and the active region 800a are arranged in sequence along the second direction $D_2$ and next to the active regions 800f, 800d and 800b, respectively. The dummy gate 800c is disposed between the active regions 800a, 800d and 800e.

In some embodiments, the gate widths $W_{810a}$, $W_{820a}$, $W_{850a}$, $W_{860a}$, $W_{810b}$, $W_{820b}$, $W_{830b}$, $W_{840b}$, $W_{850b}$, and $W_{860b}$ may be equal. In some embodiments, the gate widths $W_{820a}$, $W_{850a}$, and $W_{860a}$ may be greater than the gate widths $W_{810b}$, $W_{820b}$, $W_{830b}$, $W_{840b}$, $W_{850b}$ and $W_{860b}$. In some embodiments, the gate widths $W_{810a}$, $W_{820a}$, $W_{850a}$, $W_{860a}$, $W_{810b}$, $W_{820b}$, $W_{830b}$, $W_{840b}$, $W_{850b}$, and $W_{860b}$ may be different from each other. In some embodiments, the gate structures 810, 820, 830, 840, 850 and 860 may be fin structure. In other embodiments, the gate structures 810, 820, 830, 840, 850, and 860 may be planar.

From the above descriptions, the Vt of the semiconductor devices can be easily modify by using the structure of different gate widths instead of filling different work function metal and metal gate. The multi-shaped of the gate structure and dummy gate structure can increase the much flexible for the layout designer for NCFET circuit.

In some embodiments, a method for manufacturing a semiconductor device includes forming a first fin on a first active region of a semiconductor substrate and a second fin on a second active region of the semiconductor substrate. A first dummy gate is then formed over the first fin and a second dummy gate is formed over the second fin, wherein the first dummy gate has a first gate width along a lengthwise direction of the first fin, the second dummy gate has a second gate width along the lengthwise direction of the second fin, the first gate width is different from the second gate width. At least one of the first dummy gate and the second dummy gate is removed. A ferroelectric layer is then formed over the semiconductor substrate. At least one metal gate electrode is formed on the ferroelectric layer.

In some embodiments, the method for manufacturing a semiconductor device further includes performing a first monitoring process to examine ferroelectric property of the ferroelectric layer after forming the ferroelectric layer.

In some embodiments, the method for manufacturing a semiconductor device further includes forming a capping metal layer on the ferroelectric layer, and performing a post annealing process.

In some embodiments, the method for manufacturing a semiconductor device further includes performing a second monitoring process to examine ferroelectric property of the ferroelectric layer after the post annealing process.

In some embodiments, the method for manufacturing a semiconductor device further includes forming a barrier metal layer on the ferroelectric layer, and forming a work function tuning metal layer on the barrier metal layer.

In some embodiments, the method for manufacturing a semiconductor device further includes forming a hard mask on the first fin, and removing a portion of the work function tuning metal layer to expose the barrier metal layer over the second fin.

In some embodiments, the method for manufacturing a semiconductor device further includes forming a spacer on the first fin and the second fin, and epitaxially growing source and drain regions over a portion of the first fin and second fin.

In some embodiments, the method for manufacturing a semiconductor device further includes forming a contact etch stop layer (CESL) and an inter-layer dielectric (ILD) over the semiconductor substrate.

In some embodiments, the method for manufacturing a semiconductor device further includes retaining the at least one of the first dummy gate and the second dummy gate.

In some embodiments, the forming the ferroelectric layer on the semiconductor substrate includes performing an atomic layer deposition (ALD) to form the ferroelectric layer.

In some embodiments, the forming the ferroelectric layer on the semiconductor substrate includes in-situ doping a dopant in $HfO_2$ during ALD, and the dopant includes semiconductor material and metal elements.

12 In some embodiments, the method for manufacturing a semiconductor device further includes forming an interfacial layer on at least one of the first fin and second fin before forming the ferroelectric layer.

In some embodiments, a semiconductor device includes a semiconductor substrate, a first fin and a second fin on the semiconductor substrate, a ferroelectric layer over the first fin and the second fin, a first gate electrode over the first fin, and a second gate electrode over the second fin, wherein the first gate electrode has a first gate width along a lengthwise direction of the first fin, the second gate electrode has a second gate width along the lengthwise direction of the second fin, the first gate width is different from the second gate width.

In some embodiments, the semiconductor device further includes a work function tuning metal layer on the ferroelectric layer, and a barrier metal layer on the ferroelectric layer over the first fin.

In some embodiments, one of the first gate electrode and the second gate electrode is a dummy gate electrode.

In some embodiments, an integrated circuit comprising a semiconductor substrate comprising a first active region, a second active region, and a third active region, wherein the first active region and the third active region are arranged on two immediately adjacent sides of the second active region, the first active region, the second active region, and the third active region are electrically isolated from each other, a first gate structure extending along a first direction and crossing the first active region and the second active region, a second gate structure extending along the first direction and traversing the first active region and the second active region, and a third gate structure extending along the first direction in the third active region, wherein the first gate structure, the second gate structure and the third gate structure are spaced apart, the first gate structure and the second gate structure has a first gate length measured along the first direction, the third gate structure has a second gate length measured along the first direction, and the first gate length is greater than the second gate length.

In some embodiments, the first gate structure has different gate widths across the first active region and the second active region.

In some embodiments, the first gate structure and the second gate structure includes a ferroelectric layer.

In some embodiments, the integrated circuit includes a dummy gate structure aligned with the second gate structure and extending along the first direction.

In some embodiments, the integrated circuit includes a third gate structure disposed next to the second gate structure opposing to the first gate structure.

The foregoing outlines features of several embodiments so that those skilled in the art may better understand the aspects of the instant disclosure. Those skilled in the art should appreciate that they may readily use the instant disclosure as a basis for designing or modifying other processes and structures for carrying out the same purposes and/or achieving the same advantages of the embodiments introduced herein. Those skilled in the art should also realize that such equivalent constructions do not depart from the spirit and scope of the instant disclosure, and that they may make various changes, substitutions, and alterations herein without departing from the spirit and scope of the instant disclosure.

What is claimed is:

1. A method for manufacturing a semiconductor device, comprising:
   forming a first fin on a first active region of a semiconductor substrate and a second fin on a second active region of the semiconductor substrate;
   forming a first dummy gate over the first fin and a second dummy gate over the second fin, wherein the first dummy gate has a first gate width along a lengthwise direction of the first fin, the second dummy gate has a second gate width along the lengthwise direction of the second fin, the first gate width is different from the second gate width;
   removing at least one of the first dummy gate and the second dummy gate;
   forming a ferroelectric layer over the semiconductor substrate;
   forming a barrier metal layer and a work function tuning metal layer over the ferroelectric layer;
   forming a hard mask on the first fin;
   removing a portion of the work function tuning metal layer to expose the barrier metal layer over the second fin; and
   forming at least one metal gate electrode on the ferroelectric layer.

2. The method of claim 1, further comprising:
   performing a first monitoring process to examine a ferroelectric property of the ferroelectric layer after forming the ferroelectric layer.

3. The method of claim 1, further comprising:
   performing a post annealing process.

4. The method of claim 3, further comprising:
   performing a second monitoring process to examine a ferroelectric property of the ferroelectric layer after the post annealing process.

5. The method of claim 3, wherein forming the barrier metal layer and the work function tuning metal layer comprises:
   forming the work function tuning metal layer on the barrier metal layer.

6. The method of claim 1, further comprising:
   forming a spacers on the first fin and the second fin; and
   epitaxially growing source and drain regions over a portion of the first fin and second fin.

7. The method of claim 6, further comprising:
   forming a contact etch stop layer (CESL) and an inter-layer dielectric (ILD) over the semiconductor substrate.

8. The method of claim 1, further comprising:
   retaining the at least one of the first dummy gate and the second dummy gate.

9. The method of claim 1, wherein the forming the ferroelectric layer on the semiconductor substrate comprises:
   performing an atomic layer deposition (ALD) to form the ferroelectric layer.

10. The method of claim 1, wherein the forming the ferroelectric layer on the semiconductor substrate comprises:
    in-situ doping a dopant in $HfO_2$ during ALD, and the dopant includes semiconductor material and metal elements.

11. The method of claim 1, further comprising:
    forming an interfacial layer on at least one of the first fin and second fin before forming the ferroelectric layer.

12. A method for manufacturing a semiconductor device, comprising:
    forming a first gate dielectric layer over a substrate;
    forming a second gate dielectric layer over the first gate dielectric layer;
    modifying a property of the second gate dielectric layer;
    forming a capping metal layer over the second gate dielectric layer;
    annealing the second gate dielectric layer and the capping metal layer, wherein annealing the second gate dielectric layer and the capping metal layer provides a mechanical stress to the second gate dielectric layer for a crystalline transition of the second gate dielectric layer; and
    forming a gate electrode over the second gate dielectric layer.

13. The method of claim 12, wherein modifying the property of the second gate dielectric layer includes doping the second gate dielectric layer with a metallic dopant.

14. The method of claim 12, wherein modifying the property of the second gate dielectric layer includes lowering a resistivity of the second gate dielectric layer than the first dielectric layer.

15. The method of claim 12, further comprising:
    after forming the second gate dielectric layer, monitoring ferroelectricity of the second gate dielectric layer.

16. The method of claim 12, further comprising:
    after annealing the second gate dielectric layer and the capping metal layer, monitoring ferroelectricity of the second gate dielectric layer.

17. A method for manufacturing a semiconductor device, comprising:
    forming a gate dielectric layer over a substrate;
    annealing the gate dielectric layer to drive a crystalline transition of the gate dielectric layer from one phase to another, wherein annealing the gate dielectric layer drives the crystalline transition of the gate dielectric layer from a high-temperature tetragonal phase to a high-pressure ferroelectric orthorhombic phase; and
    forming a gate electrode over the gate dielectric layer.

18. The method of claim 17, wherein annealing the gate dielectric layer drives the crystalline transition of the gate dielectric layer from an amorphous phase to the high-temperature tetragonal phase.

19. The method of claim 17, further comprising, prior to forming the gate dielectric layer, forming a high-k dielectric layer over the substrate.

20. The method of claim 17, further comprising, prior to forming the gate dielectric layer, forming an interfacial layer over the substrate.

* * * * *